(12) United States Patent
Nishimoto et al.

(10) Patent No.: US 8,215,766 B2
(45) Date of Patent: Jul. 10, 2012

(54) OPTICAL ARTICLE AND METHOD FOR PRODUCING THE SAME

(75) Inventors: Keiji Nishimoto, Ina (JP); Takashi Noguchi, Shiojiri (JP); Hiroyuki Seki, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 10 days.

(21) Appl. No.: 12/643,762

(22) Filed: Dec. 21, 2009

(65) Prior Publication Data

US 2010/0177395 A1 Jul. 15, 2010

(30) Foreign Application Priority Data

Jan. 14, 2009 (JP) ................ 2009-005421
Aug. 28, 2009 (JP) ................ 2009-197787

(51) Int. Cl.
*G02C 5/00* (2006.01)
*G02C 7/02* (2006.01)
*B32B 9/04* (2006.01)
*B05D 5/06* (2006.01)
*G02B 5/28* (2006.01)

(52) U.S. Cl. ....... 351/41; 351/177; 428/411.1; 427/164; 359/589

(58) Field of Classification Search ............ 351/41, 351/163–166, 177, 159; 428/411.1, 412, 428/426; 427/164–169, 162; 359/580–582, 359/585–586, 588–590

See application file for complete search history.

(56) References Cited

U.S. PATENT DOCUMENTS

| 5,619,288 | A | * | 4/1997 | White et al. ................ 351/159 |
| 6,296,793 | B1 | | 10/2001 | Anthes et al. |
| 6,416,872 | B1 | | 7/2002 | Maschwitz |
| 7,618,753 | B2 | | 11/2009 | Yoshikawa et al. |
| 2002/0155361 | A1 | * | 10/2002 | Takeuchi et al. ................ 430/5 |
| 2006/0251884 | A1 | * | 11/2006 | Naito et al. ................ 428/331 |
| 2007/0159697 | A1 | * | 7/2007 | Terayama ................ 359/586 |
| 2008/0102379 | A1 | | 5/2008 | Wu et al. |

FOREIGN PATENT DOCUMENTS

| EP | 1227346 A2 | 7/2002 |
| EP | 1811335 A1 | 7/2007 |
| JP | 2004-341052 | 12/2004 |
| WO | 0218132 A2 | 3/2008 |

OTHER PUBLICATIONS

European search report for corresponding European application 10150514.7 lists the references above.

* cited by examiner

*Primary Examiner* — Dawayne A Pinkney
(74) *Attorney, Agent, or Firm* — DLA Piper LLP (US)

(57) ABSTRACT

A method for producing an optical article. A first layer that is light-transmissive is formed on an optical substrate directly or with an additional layer in between. A silicide material, light-transmissive thin film is formed on the surface of the first layer.

14 Claims, 16 Drawing Sheets

| | | | ANTIREFLECTION LAYER (THICKNESS (nm)) | | | | | | | | |
|---|---|---|---|---|---|---|---|---|---|---|---|
| | SAMPLE | HC | FIRST LAYER SiO$_2$ | SECOND LAYER ZrO$_2$ | THIRD LAYER SiO$_2$ | FOURTH LAYER ZrO$_2$ | FIFTH LAYER ELECTRICALLY CONDUCTIVE LAYER | SIXTH LAYER SiO$_2$ | ANTI-FOULING LAYER | CONDITIONS OF SILICIDE LAYER FORMATION | SHEET RESISTANCE (Ω/SQ) |
| TYPE OF ANTI-REFLECTION LAYER STRUCTURE | | | | | | | | | | | |
| EXAMPLE 1 / A1 | S1 | PRESENT | 150 | 30 | 21 | 55 | SILICIDE TiSi (3) | 85 | PRESENT | ION-ASSISTED DEPOSITION, Si (DEPOSITION TIME:10 S), KIND OF IONS: Ar, VOLTAGE: 1000 eV, CURRENT: 200 mA | 7×10$^9$ |
| EXAMPLE 2 / A1 | S2 | PRESENT | 150 | 30 | 21 | 55 | SILICIDE TiSi (1) | 85 | PRESENT | TiSi COMPOUND DEPOSITION | 1×10$^{10}$ |
| COMPARATIVE EXAMPLE 1 / A3 | R1 | PRESENT | 150 | 30 | 21 | 55 | METAL Si (3) | 85 | PRESENT | NA | 9×10$^{12}$ |
| COMPARATIVE EXAMPLE 2 / A4 | R2 | PRESENT | 150 | 30 | 21 | 55 | ITO (3) | 85 | PRESENT | NA | 2×10$^{12}$ |

FIG. 4

| | | TYPE OF ANTIREFLECTION LAYER STRUCTURE | SAMPLE | ANTIREFLECTION LAYER (THICKNESS (nm)) | | | | | |
|---|---|---|---|---|---|---|---|---|---|
| | | | | FIRST LAYER | SECOND LAYER | THIRD LAYER | FOURTH LAYER | FIFTH LAYER ELECTRICALLY CONDUCTIVE LAYER | SIXTH LAYER |
| | | | | SiO₂ | ZrO₂ | SiO₂ | ZrO₂ | | SiO₂ |
| EXAMPLES 1 TO 9 | | A1 | S1 TO S9 | 150 | 30 | 21 | 55 | SILICIDE TiSi OR ZrSi | 85 |
| COMPARATIVE EXAMPLE 1 | | A3 | R1 | 150 | 30 | 21 | 55 | METAL Si (3) | 85 |
| COMPARATIVE EXAMPLE 2 | | A4 | R2 | 150 | 30 | 21 | 55 | ITO (3) | 85 |
| COMPARATIVE EXAMPLE 3 | | A2 | R3 | 150 | 30 | 21 | 55 | ABSENT | 85 |

| SAMPLE | TYPE OF ANTI-REFLECTION LAYER STRUCTURE | SUBSTRATE | HC | ANTIREFLECTION LAYER (THICKNESS (nm)) FOURTH LAYER ZrO2 | ANTIREFLECTION LAYER FIFTH LAYER ELECTRICALLY CONDUCTIVE LAYER | ANTIREFLECTION LAYER SIXTH LAYER SiO2 | ANTI-FOULING LAYER | CONDITIONS OF SILICIDE LAYER FORMATION | EVALUATION RESULTS SHEET RESISTANCE (Ω/SQ) | EVALUATION RESULTS DUST ADHESION TEST | EVALUATION RESULTS ABSORPTION LOSS (%) | EVALUATION RESULTS CHEMICAL RESISTANCE | EVALUATION RESULTS SWELLING |
|---|---|---|---|---|---|---|---|---|---|---|---|---|---|
| S1 | A1 | PLASTIC LENS | PRESENT | 55 | SILICIDE TiSi (3) | 85 | PRESENT | ION-ASSISTED DEPOSITION, Si (DEPOSITION TIME:10 S), KIND OF IONS: Ar, VOLTAGE: 1000 eV, CURRENT: 200 mA | $7 \times 10^9$ | GOOD | NA | GOOD | ABSENT |
| S2 | A1 | PLASTIC LENS | PRESENT | 55 | SILICIDE TiSi (1) | 85 | PRESENT | TiSi COMPOUND DEPOSITION | $1 \times 10^{10}$ | GOOD | NA | GOOD | ABSENT |
| S3 | A1 | CLEAR GLASS | ABSENT | 55 | SILICIDE TiSi (1) | 85 | PRESENT | TiSi COMPOUND DEPOSITION | $1 \times 10^{10}$ | GOOD | 0.5 | GOOD | ABSENT |
| S4 | A1 | PLASTIC LENS | PRESENT | 55 | SILICIDE ZrSi (1 TO 5) | 85 | PRESENT | ION-ASSISTED DEPOSITION, Si (DEPOSITION TIME:10 S), KIND OF IONS: Ar, VOLTAGE: 1000 eV, CURRENT: 150 mA | $8 \times 10^{11}$ | GOOD | NA | GOOD | ABSENT |
| S5 | A1 | CLEAR GLASS | ABSENT | 55 | SILICIDE ZrSi (1 TO 5) | 85 | PRESENT | ION-ASSISTED DEPOSITION, Si (DEPOSITION TIME:10 S), KIND OF IONS: Ar, VOLTAGE: 1000 eV, CURRENT: 150 mA | $8 \times 10^{11}$ | GOOD | 0.3 | GOOD | ABSENT |
| S6 | A1 | PLASTIC LENS | PRESENT | 55 | SILICIDE TiSi (1 TO 5) | 85 | PRESENT | ION-ASSISTED DEPOSITION, Si (DEPOSITION TIME:10 S), KIND OF IONS: Ar, VOLTAGE: 500 eV, CURRENT: 150 mA | $2 \times 10^9$ | GOOD | NA | GOOD | ABSENT |
| S7 | A1 | CLEAR GLASS | ABSENT | 55 | SILICIDE TiSi (1 TO 5) | 85 | PRESENT | ION-ASSISTED DEPOSITION, Si (DEPOSITION TIME:10 S), KIND OF IONS: Ar, VOLTAGE: 500 eV, CURRENT: 150 mA | $2 \times 10^9$ | GOOD | 1.2 | GOOD | ABSENT |
| S8 | A1 | PLASTIC LENS | PRESENT | 55 | SILICIDE TiSi (1 TO 5) | 85 | PRESENT | ION-ASSISTED DEPOSITION, Si (DEPOSITION TIME:10 S), KIND OF IONS: Ar/O2 (1:1), VOLTAGE: 250 eV, CURRENT: 150 mA | $3 \times 10^{10}$ | GOOD | NA | GOOD | ABSENT |
| S9 | A1 | CLEAR GLASS | ABSENT | 55 | SILICIDE TiSi (1 TO 5) | 85 | PRESENT | ION-ASSISTED DEPOSITION, Si (DEPOSITION TIME:10 S), KIND OF IONS: Ar/O2 (1:1), VOLTAGE: 250 eV, CURRENT: 150 mA | $3 \times 10^{10}$ | GOOD | 0.4 | GOOD | ABSENT |
| R1 | A3 | PLASTIC LENS | PRESENT | 55 | METAL Si (3) | 85 | PRESENT | NA | $9 \times 10^{12}$ | POOR | NA | GOOD | ABSENT |
| R2 | A4 | PLASTIC LENS | PRESENT | 55 | ITO (3) | 85 | PRESENT | NA | $2 \times 10^{12}$ | FAIR | NA | POOR | ABSENT |
| R3 | A2 | CLEAR GLASS | ABSENT | 55 | ABSENT | 85 | PRESENT | NA | $5 \times 10^{14}$ | POOR | 0.1 | NA | ABSENT |

PLASTIC LENS: SEIKO SUPER SOVEREIGN (MANUFACTURED BY SEIKO EPSON), CLEAR GLASS: B270, HC: HARD COATING LAYER, NA: NOT APPLICABLE

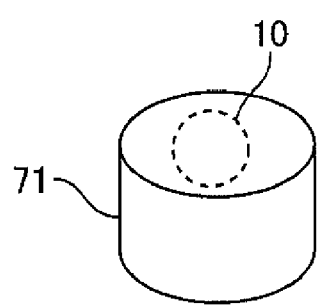 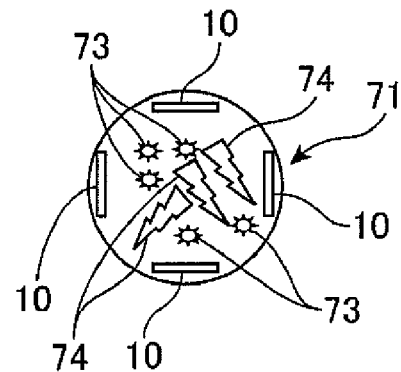
FIG. 9A    FIG. 9B
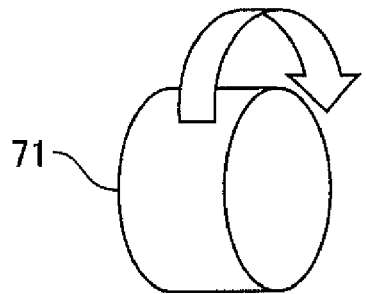
FIG.10
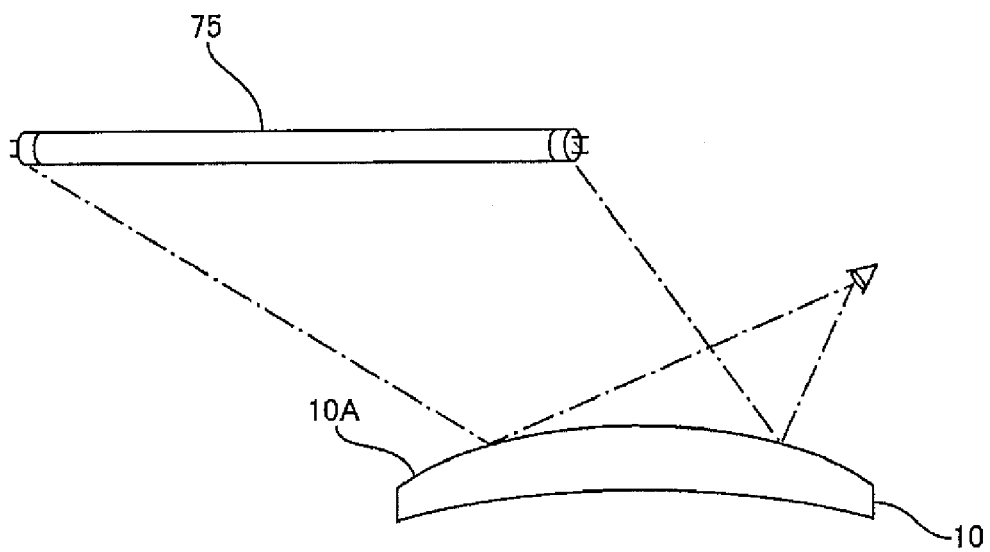
FIG.11

| | TYPE OF ANTIREFLECTION LAYER STRUCTURE | SAMPLE | ANTIREFLECTION LAYER (THICKNESS (nm)) | | | | | | | | |
|---|---|---|---|---|---|---|---|---|---|---|---|
| | | | FIRST LAYER SiO$_2$ | SECOND LAYER TiO$_2$ | THIRD LAYER SiO$_2$ | FOURTH LAYER TiO$_2$ | FIFTH LAYER SiO$_2$ | SIXTH LAYER TiO$_2$ | SEVENTH LAYER ELECTRICALLY CONDUCTIVE LAYER | EIGHTH LAYER SiO$_2$ |
| EXAMPLES 10 TO 17 | B1 | S10 TO S17 | 44 | 10 | 57 | 36 | 25 | 36 | SILICIDE TiSi (1 TO 5) | 101 |
| COMPARATIVE EXAMPLES 4 AND 5 | B2 | R4, R5 | 44 | 10 | 57 | 36 | 25 | 36 | ABSENT | 101 |
| COMPARATIVE EXAMPLE 6 | B3-1 | R6 | 28.4 | 6.7 | 204.3 | 23.2 | 35.7 | 26.7 | ITO (2.5) | 99.5 |
| COMPARATIVE EXAMPLE 7 | B3-2 | R7 | 28.4 | 6.6 | 204.3 | 23.2 | 35.7 | 26.7 | ITO (3.5) | 99.5 |
| COMPARATIVE EXAMPLE 8 | B3-3 | R8 | 28.7 | 6.7 | 204.4 | 23.3 | 35.5 | 26.2 | ITO (5) | 98.8 |
| COMPARATIVE EXAMPLE 9 | B3-4 | R9 | 28.7 | 6.7 | 204.4 | 23.3 | 35.5 | 25 | ITO (7) | 97.8 |
| COMPARATIVE EXAMPLE 10 | B3-5 | R10 | 28.7 | 6.7 | 204.4 | 23.3 | 35.4 | 23 | ITO (10) | 98.2 |
| COMPARATIVE EXAMPLE 11 | B3-6 | R11 | 27.7 | 6.7 | 204.4 | 23.3 | 35.5 | 20 | ITO (15) | 98.7 |

| SAMPLE | TYPE OF ANTI-REFLEC-TION LAYER STRUCTURE | SUBSTRATE | HC | ANTIREFLECTION LAYER (THICKNESS) (nm) | | | | ANTI-FOULING LAYER | CONDITIONS OF SILICIDE LAYER FORMATION | EVALUATION RESULTS | | | | |
|---|---|---|---|---|---|---|---|---|---|---|---|---|---|---|
| | | | | SIXTH LAYER TiO₂ | SEVENTH LAYER ELECTRICALLY CONDUCTIVE LAYER | | EIGHTH LAYER SiO₂ | | | SHEET RESISTANCE (Ω/SQ) | DUST ADHESION TEST | ABSORPTION LOSS (%) | CHEMICAL RESISTANCE | SWELLING |
| S10 | B1 | PLASTIC LENS | PRESENT | 36 | SILICIDE TiSi | (1 TO 5) | 101 | PRESENT | ION-ASSISTED DEPOSITION, Si (DEPOSITION TIME:10 S), KIND OF IONS: Ar, VOLTAGE: 1000 eV, CURRENT:150 mA | 5×10⁷ | GOOD | NA | GOOD | ABSENT |
| S11 | B1 | CLEAR GLASS | ABSENT | 36 | SILICIDE TiSi | (1 TO 5) | 101 | PRESENT | ION-ASSISTED DEPOSITION, Si (DEPOSITION TIME:10 S), KIND OF IONS: Ar, VOLTAGE: 1000 eV, CURRENT:150 mA | 5×10⁷ | GOOD | 3 | GOOD | ABSENT |
| S12 | B1 | PLASTIC LENS | PRESENT | 36 | SILICIDE TiSi | (1 TO 5) | 101 | PRESENT | ION-ASSISTED DEPOSITION, Si (DEPOSITION TIME:5 S), KIND OF IONS: Ar, VOLTAGE: 1000 eV, CURRENT:150 mA | 8×10⁸ | GOOD | NA | GOOD | ABSENT |
| S13 | B1 | CLEAR GLASS | ABSENT | 36 | SILICIDE TiSi | (1 TO 5) | 101 | PRESENT | ION-ASSISTED DEPOSITION, Si (DEPOSITION TIME:5 S), KIND OF IONS: Ar, VOLTAGE: 1000 eV, CURRENT:150 mA | 5×10⁸ | GOOD | 1.8 | GOOD | ABSENT |
| S14 | B1 | PLASTIC LENS | PRESENT | 36 | SILICIDE TiSi | (1 TO 5) | 101 | PRESENT | ION-ASSISTED DEPOSITION, Si (DEPOSITION TIME:10 S), KIND OF IONS: Ar, VOLTAGE: 500 eV, CURRENT:150 mA | 5×10⁹ | GOOD | NA | GOOD | ABSENT |
| S15 | B1 | CLEAR GLASS | ABSENT | 36 | SILICIDE TiSi | (1 TO 5) | 101 | PRESENT | ION-ASSISTED DEPOSITION, Si (DEPOSITION TIME:5 S), KIND OF IONS: Ar, VOLTAGE: 500 eV, CURRENT:150 mA | 5×10⁹ | GOOD | 1.3 | GOOD | ABSENT |
| S16 | B1 | PLASTIC LENS | PRESENT | 36 | SILICIDE TiSi | (1 TO 5) | 101 | PRESENT | ION-ASSISTED DEPOSITION, Si (DEPOSITION TIME:10 S), KIND OF IONS: Ar/O2 (1:1), VOLTAGE: 250 eV, CURRENT: 150 mA | 1×10⁹ | GOOD | NA | GOOD | ABSENT |
| S17 | B1 | CLEAR GLASS | ABSENT | 36 | SILICIDE TiSi | (1 TO 5) | 101 | PRESENT | ION-ASSISTED DEPOSITION, Si (DEPOSITION TIME:5 S), KIND OF IONS: Ar/O2 (1:1), VOLTAGE: 250 eV, CURRENT: 150 mA | 1×10¹⁰ | GOOD | 0.5 | GOOD | ABSENT |
| R4 | B2 | PLASTIC LENS | PRESENT | 36 | ABSENT | | 101 | PRESENT | NA | 5×10¹³ | POOR | NA | NA | ABSENT |
| R5 | B2 | CLEAR GLASS | ABSENT | 36 | ABSENT | | 101 | PRESENT | NA | 5×10¹³ | POOR | 0.1 | NA | ABSENT |
| R6 | B3-1 | PLASTIC LENS | PRESENT | 26.7 | ITO | (2.5) | 99.5 | PRESENT | NA | 2×10¹³ | POOR | — | POOR | ABSENT |
| R7 | B3-2 | PLASTIC LENS | PRESENT | 26.7 | ITO | (3.5) | 99.5 | PRESENT | NA | 2×10¹² | FAIR | — | POOR | ABSENT |
| R8 | B3-3 | PLASTIC LENS | PRESENT | 26.2 | ITO | (5) | 98.8 | PRESENT | NA | 2.5×10¹¹ | GOOD | — | POOR | ABSENT |
| R9 | B3-4 | PLASTIC LENS | PRESENT | 25 | ITO | (7) | 97.8 | PRESENT | NA | 4×10¹¹ | GOOD | — | POOR | ABSENT |
| R10 | B3-5 | PLASTIC LENS | PRESENT | 23 | ITO | (10) | 98.2 | PRESENT | NA | 3×10¹¹ | GOOD | — | POOR | PRESENT |
| R11 | B3-6 | PLASTIC LENS | PRESENT | 20 | ITO | (15) | 98.7 | PRESENT | NA | 1.5×10¹¹ | GOOD | — | POOR | PRESENT |

PLASTIC LENS: SEIKO SUPER SOVEREIGN (MANUFACTURED BY SEIKO EPSON), CLEAR GLASS: B270, HC: HARD COATING LAYER, NA: NOT APPLICABLE

OPTICAL ARTICLE AND METHOD FOR PRODUCING THE SAME

CROSS-REFERENCE TO RELATED APPLICATIONS

This application claims the benefit of priority under 35 USC 119 of Japanese application no. 2009-005421, filed on Jan. 14, 2009, and Japanese application no. 2009-197787, filed on Aug. 28, 2009, which are incorporated herein by reference.

BACKGROUND

1. Technical Field

The present invention relates to an optical article for use as a lens, such as a spectacle lens, or a like optical material or product, and also to a method for producing the same.

2. Related Art

Optical articles, such as spectacle lenses, have a substrate (optical substrate) with various functions and, on the surface of the substrate, layers (films) that perform various functions for enhancing the functions of the substrate and protecting the substrate. Known examples of such layers are a hard coating layer for securing the durability of a lens substrate, an antireflection layer for preventing ghosting and flickering, and the like. A typical antireflection layer is a so-called multilayer antireflection layer that is formed by alternately laminating oxide films with different refractive indexes on the surface of a lens substrate having laminated thereon a hard coating layer.

JP-A-2004-341052, which is an example of related art, describes the provision of a novel optical element having antistatic performance suitable for substrates with low heat resistance. According to JP-A-2004-341052, in a spectacle lens or a like optical element comprising a plastic optical substrate and a multilayer antireflection film thereon, the antireflection film includes a transparent, electrically conductive layer. The transparent, electrically conductive layer is formed by ion-assisted vacuum deposition, and other layers of the antireflection film are formed by electron-beam vacuum deposition. As materials for the electrically conductive layer, inorganic oxides of one or more of indium, tin, and zinc are mentioned. ITO (Indium Tin Oxide: mixture of indium oxide and tin oxide) is described as particularly preferred.

It is known that a layer of indium tin oxide (ITO) may be inserted in order to impart electrical conductivity to a film or a layer formed on the surface of a substrate for the sake of antistatic performance, electromagnetic shielding, and the like. However, an ITO layer has high transparency and excellent antistatic properties, but is nonresistant to acid, alkali, and like chemicals. Therefore, when such a layer is employed on a spectacle lens, because human sweat is salty and acidic, the durability of the antireflection layer that includes the ITO layer may be of concern.

Meanwhile, a thin layer of metal, such as silver, may be formed to give electrical conductivity. However, an antireflection layer, a hard coating layer, an antifouling layer, and like layers formed on the surface of the substrate of an optical article often primarily consist of a silicon-based compound or oxide, so the compatibility with such a layer is of concern. For example, gold generally has poor adhesion, and film separation may thus occur. Silver may undergo a reduction in electrical conductivity due oxidation.

SUMMARY

One aspect of the invention provides a method for producing an optical article (optical element), comprising forming a light-transmissive first layer on an optical substrate directly or with an additional layer in between, and forming a silicide material, light-transmissive thin film on the surface of the first layer. The silicide is a transition metal silicide, which has low resistance, exhibits excellent compatibility with silicon-based compounds and/or oxides, such as silicon oxide and organosilicon compounds, and is almost stable to acids other than fluoric acid. Accordingly, an optical article having low sheet resistance and high durability can be produced. Therefore, an optical article having an antistatic function and/or an electromagnetic wave shielding function, for example, can be produced and provided more easily. Low resistance as used herein means lower electrical resistance.

Silicides have low resistance. For example, the resistivity of $TiSi_2$, a kind of titanium silicide, is $2\times10^{-5}$ $\Omega\cdot cm$, whereas the resistivity of ITO is $10^{-3}$ to $10^{-4}$ $\Omega\cdot cm$. Thus the resistivity of a silicide is less than the resistivity of ITO. Accordingly, by employing a silicide layer as an electrically conductive layer, even in the case of a thin film, the layer resistance on the substrate can be sufficiently reduced. Therefore, the light transmittance of the silicide film can be secured, and the thin film of silicide can be inserted without change or with little change from the existing antireflection layer structure.

The light-transmissive thin film containing a silicide (transition metal silicide) can be formed by depositing silicon and metal on the surface of the first layer. It is also possible that a transition metal silicide is deposited on the surface of the first layer. When the first layer is a metal-oxide-containing layer, it is also possible to implant silicon into the surface of the first layer by ion-assisted deposition, sputtering, or the like, thereby forming a silicide layer on the first layer.

Typically, the first layer is included in an inorganic or organic antireflection layer that is laminated on the optical substrate with a hard coating layer in between, or with a primer layer and a hard coating layer in between. Forming the first layer includes forming one first layer or a plurality of first layers of an antireflection layer having a multilayer structure. The sheet resistance of the multilayer antireflection layer can thereby be reduced. The first layer may alternatively be the inorganic or organic antireflection layer. The method may further include forming an antifouling layer on the first layer directly or with an additional layer in between.

Another aspect of the invention provides an optical article comprising an optical substrate, a light-transmissive first layer formed on the optical substrate directly or with an additional layer in between, and a silicide material, light-transmissive thin film formed on the surface of the first layer. The sheet resistance of the layer and a system of films or layers, including the above-referenced layer, formed on the optical substrate can be reduced by forming the silicide material, light-transmissive thin film on the surface of the first layer. Accordingly, electrical conductivity can be imparted to the films or layers formed on the surface of the substrate, thereby imparting an antistatic function, an electromagnetic shielding function, and the like, or providing such functions. Further, as compared with ITO, silicides have higher stability against acid, alkali, and like chemicals, and therefore, a reduction in durability can be suppressed. This can thus be applied to personal articles (elements, products) for which antistatic performance is required, such as spectacle lenses, camera lenses, PDA displays, DVDs, and other optical articles.

The first layer is typically a layer included in an inorganic antireflection layer. That is, when the optical article has a multilayer antireflection layer, the first layer may be a layer included in the multilayer antireflection layer. It is also possible to provide a plurality of first layers that are some layers of the multilayer structure of the antireflection layer. The first layer may be an organic antireflection layer. Further, the optical article may also have an antifouling layer formed on the first layer directly or with an additional layer in between. Typically, the optical substrate is a plastic lens substrate, such as of a spectacle lens, for example.

Still another aspect of the invention provides a pair of spectacles comprising a spectacle lens and a frame having mounted thereto the spectacle lens.

Still another aspect of the invention provides a system that includes the above optical article with one side thereof facing the outside, and is used for seeing an image through the optical article. A typical example of such a system is an information-processing apparatus including a clock, a display, a terminal with a display, etc. Buildup of static electricity on the display surface can be prevented, and also the electromagnetic shielding ability can be improved.

Still another aspect of the invention provides a system including the above optical article and an image-forming apparatus for projecting an image through the optical article. A typical example of such a system is a projector. Typically, the optical article is a projection lens, a dichroic prism, a cover glass, or the like. The system may be applied to a light valve of an LCD (liquid crystal device), a kind of image-forming apparatus, or to an element therein.

Still another aspect of the invention provides a system including the above optical article and an imaging apparatus for capturing an image through the optical article. A typical example of such a system is a camera. Typically, the optical article is an imaging lens, a cover glass, or the like. The system may be applied to a CCD, a kind of imaging apparatus.

Still another aspect of the invention provides a system including the above optical article and a medium that allows access through the optical article. Typical examples of such systems include DVDs and like information recorders having an internal recording medium, which are required to allow little static electricity buildup on the surface, and ornaments having an internal medium that gives aesthetic expression.

BRIEF DESCRIPTION OF THE DRAWINGS

The invention will be described with reference to the accompanying drawings, wherein like numbers reference like elements.

FIG. 4 is a table showing the layer structure and the sheet resistance of antireflection layers related to group A.

FIG. 5A is a sectional view showing measurement of sheet resistance, while

FIG. 7 is a table showing the layer structure of antireflection layers related to group A.

FIG. 8 is a table showing the results of evaluation of samples related to group A.

FIG. 9A shows the external appearance of a test apparatus for use in the abrasion process of chemical resistance test, and FIG. 9B shows the internal structure of the test apparatus.

FIG. 10 shows the rotation of the test apparatus for use in the abrasion process of chemical resistance test.

FIG. 11 is a schematic diagram of an apparatus for determining swelling, for use in moisture resistance test.

FIG. 14 is a table showing the layer structure of antireflection layers related to group B.

FIG. 15 is a table showing the results of evaluation of samples related to group B.

DESCRIPTION OF EXEMPLARY EMBODIMENTS

Some embodiments of the invention will be described hereinafter. Although a spectacle lens is taken as an example of an optical article, optical articles to which the invention is applicable are not limited thereto.

Figure 1:
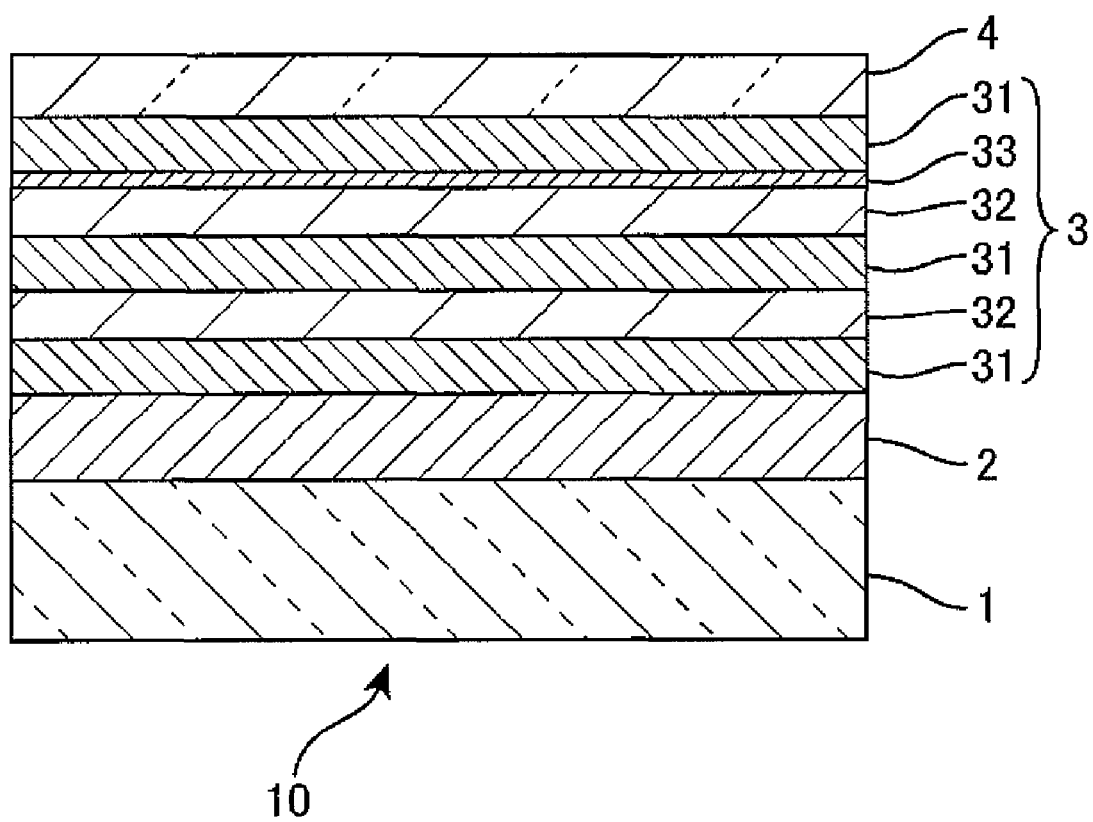
FIG. 1 is a sectional view of a lens that has an antireflection layer having the layer structure of group A.

FIG. 1 shows a typical lens structure with a sectional view of one side of the substrate. A lens 10 comprises a lens substrate 1, a hard coating layer 2 formed on the surface of the lens substrate 1, a light-transmissive antireflection layer 3 formed on the hard coating layer 2, and an antifouling layer 4 formed on the antireflection layer 3.

1. LENS OVERVIEW 1.1 Lens Substrate

The lens substrate 1 may be, but is not limited to, methacrylic resin, styrene resin, polycarbonate resin, allyl resin, diethylene glycol bisallyl carbonate resin (CR-39) or a like allyl carbonate resin, vinyl resin, polyester resin, polyether resin, urethane resin obtained by reaction of an isocyanate compound with diethylene glycol or a like hydroxy compound, thiourethane resin obtained by reaction of an isocyanate compound with a polythiol compound, transparent resin obtained by curing a polymerizable composition containing a (thio)epoxy compound having in the molecule one or more disulfide bonds, or the like. The refractive index of the lens substrate 1 may be about 1.64 to about 1.75, for example. In this embodiment, the refractive index may be within the above range, and may also exceed or fall below the above range.

1.2 Hard Coating Layer (Primer Layer)

The hard coating layer 2 improves abrasion resistance. Examples of materials used for the hard coating layer 2 include acryl-based resins, melamine-based resins, urethane-based resins, epoxy-based resins, polyvinyl-acetal-based resins, amino-based resins, polyester-based resins, polyamide-based resins, vinyl-alcohol-based resins, styrene-based resins, silicon-based resins, and mixtures or copolymers thereof. The hard coating layer 2 may be a layer of a silicone-based resin, for example, and can be formed by applying and curing a coating composition comprising metal oxide particles and a silane compound. The coating composition may contain colloidal silica, a polyfunctional epoxy compound, and like components.

Specific examples of metal oxide particles are particles of a metal oxide, such as $SiO_2$, $Al_2O_3$, $SnO_2$, $Sb_2O_5$, $Ta_2O_5$, $CeO_2$, $La_2O_3$, $Fe_2O_3$, ZnO, $WO_3$, $ZrO_2$, $In_2O_3$, or $TiO_2$, and composite particles of more than two kinds of metal oxides. A colloidal dispersion of such particles in a dispersion medium, such as water or an alcoholic or like organic solvent, may be mixed with the coating composition.

In order to secure adhesion between the lens substrate 1 and the hard coating layer 2, a primer layer may be provided between the lens substrate 1 and the hard coating layer 2. The primer layer is also effective in improving the shock resistance that has been a defect of a high-refractive-index lens substrate. Examples of resins for forming the primer layer include acryl-based resins, melamine-based resins, urethane-based resins, epoxy-based resins, polyvinyl-acetal-based resins, amino-based resins, polyester-based resins, polyamide-based resins, vinyl-alcohol-based resins, styrene-based resins, silicon-based resins, and mixtures or copolymers thereof. For the primer layer for imparting adhesion, urethane-based resins and polyester-based resins are preferably used.

Typically, the hard coating layer 2 and the primer layer are produced as follows. A coating composition is applied by dipping, spinning, spraying, or flowing, and then heated and dried at a temperature of 40 to 200° C. for several hours.

1.3 Antireflection Layer

Typically, the antireflection layer 3 formed on the hard coating layer 2 is an inorganic antireflection layer or an organic antireflection layer. The inorganic antireflection layer consists of a multilayer film, and may be formed, for example, by alternately laminating a low-refractive-index layer having a refractive index of 1.3 to 1.6 and a high-refractive-index layer having a refractive index of 1.8 to 2.6. The number of layers is preferably about five or seven. Example of inorganic substances used for layers forming the antireflection layer include $SiO_2$, SiO, $ZrO_2$, $TiO_2$, TiO, $Ti_2O_3$, $Ti_2O_5$, $Al_2O_3$, $TaO_2$, $Ta_2O_5$, $NdO_2$, NbO, $Nb_2O_3$, $NbO_2$, $Nb_2O_5$, $CeO_2$, MgO, $Y_2O_3$, $SnO_2$, $MgF_2$, $WO_3$, $HfO_2$ and $Y_2O_3$. These inorganic substances are used singly, or alternatively, two or more kinds are used in mixture.

Examples of methods for forming the antireflection layer 3 include dry methods, such as vacuum deposition, ion plating, and sputtering. As vacuum deposition, ion-beam-assisted deposition may also be employed, in which an ion beam is applied simultaneously with deposition.

One method for forming the organic antireflection layer 3 is a wet method. For example, the layer may be formed by applying a coating composition for forming an antireflection layer, which contains silica-based particles having an inner cavity (hereinafter sometimes referred to as "hollow silica-based particles") and an organic silicon compound, in the same manner as in the production of the hard coating layer and the primer layer. The reason for using hollow silica-based particles is as follows. The inner cavity thereof may contain a gas or a solvent having a lower refractive index than that of silica, whereby the refractive index of the particles is reduced as compared with silica-based particles having no cavity. As a result, an excellent antireflection effect can be imparted. Hollow silica-based particles may be produced, for example, by a method described in JP-A-2001-233611. Particles having an average diameter of 1 to 150 nm and a refractive index of 1.16 to 1.39 are preferably used. The organic antireflection layer preferably has a thickness of 50 to 150 nm. A thickness that is larger or smaller than this range may result in an insufficient antireflection effect.

1.4 Antifouling Layer

In many cases, a water-repellent film or hydrophilic anti-fogging film (antifouling layer) 4 is formed on the antireflection layer 3. The antifouling layer 4 is a layer of a fluorine-containing organosilicon compound and is formed on the antireflection layer 3 for the purpose of improving the water-repellent performance and the oil-repellent performance of the surface of the optical article (lens) 10. Preferred examples of fluorine-containing organosilicon compounds include fluorine-containing silane compounds such as described in JP-A-2005-301208 and JP-A-2006-126782.

The fluorine-containing silane compound is preferably dissolved in an organic solvent to a prescribed concentration and used as a water-repellent treatment liquid (coating composition for forming an antifouling layer). An antifouling layer can be formed by applying the water-repellent treatment liquid (coating composition for forming an antifouling layer) onto the antireflection layer. The coating method therefor may be dipping, spin coating, or the like. In addition, it is also possible to charge the water-repellent treatment liquid (coating composition for forming an antifouling layer) into metal pellets, and then form an antifouling layer by vacuum deposition or a like dry method.

The thickness of the antifouling layer is not limited, and is preferably 0.001 to 0.5 μl, and more preferably 0.001 to 0.03 μl. When the antifouling layer is too thin, this results in poor water-repellent and oil-repellent effects, while when the layer is too thick, the resulting surface is sticky, so both cases are undesirable. Further, when the thickness of the antifouling layer exceeds 0.03 μm, the antireflection effect may be impaired.

2. PRODUCTION OF SAMPLES (GROUP A)

2.1 Example 1

Sample S1

2.1.1 Selection of Lens Substrate and Formation of Hard Coating Layer

A coating liquid for forming a hard coating layer 2 was prepared as follows. First, 4.46 parts by weight of acid anhydride curing agent (trade name: liquid curing agent (C2) (manufactured by Arakawa Chemical Industries)) was mixed with 20 parts by weight of epoxy resin/silica hybrid (trade name: Compoceran E102 (manufactured by Arakawa Chemical Industries)), and stirred to give a coating liquid. The obtained coating liquid was applied onto a substrate 1 using a spin coater to a predetermined thickness, thereby forming a hard coating layer 2.

As the substrate 1, a plastic lens substrate for spectacles having a refractive index of 1.67 (manufactured by SEIKO EPSON, trade name: Seiko Super Sovereign (SSV)) was used. The coated lens substrate was calcined at 125° C. for 2 hours.

2.1.2 Formation of Antireflection Layer

2.1.2.1 Deposition Apparatus

Figure 2:
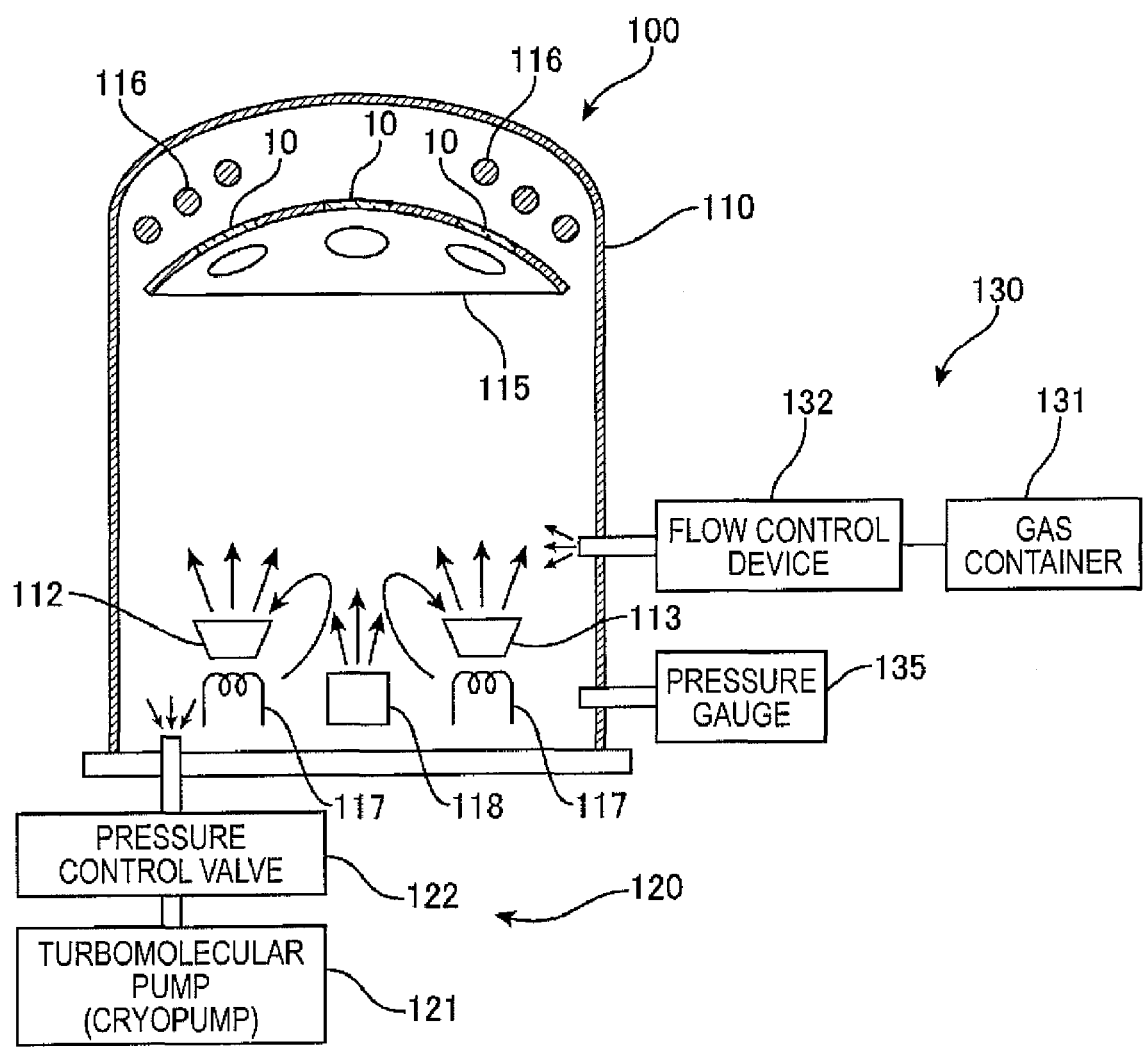
FIG. 2 schematically shows a deposition apparatus used for the production of an antireflection layer.

Subsequently, an inorganic antireflection layer 3 was produced (film formation) using a deposition apparatus 100 shown in FIG. 2. The illustrated deposition apparatus 100 is an electron-beam deposition apparatus, and has a vacuum chamber 110, an exhauster 120, and a gas feeder 130. The vacuum chamber 110 has a sample holder 115 that holds a lens sample 10 having up to a hard coating layer 2, a substrate heater 116 for heating the lens sample 10 placed in the sample holder 115, and a filament 117 that generates thermoelectrons. Thermoelectrons are accelerated by an electron gun so as to apply the thermoelectrons to the material to be deposited that is placed in evaporation sources (crucibles) 112 and 113, thereby vaporizing the same, so that the material is deposited on the lens sample 10.

In order to allow ion-assisted deposition, the deposition apparatus 100 also includes an ion gun 118 for ionizing the gas introduced into the chamber 110, accelerating, and applying to the lens sample 10. The vacuum chamber 110 may further include a cold trap for removing remaining moisture, a device for controlling layer thickness, and the like. The device for controlling layer thickness may be, for example, a reflective, optical thickness gauge, a quarts oscillator thickness gauge, or the like.

The inside of the vacuum chamber 110 can be kept at high vacuum, for example, $1 \times 10^{-4}$ Pa, by a turbomolecular pump or cryopump 121 and a pressure control, valve 122 which are included in the exhauster 120. Meanwhile, using the gas feeder 130, the inside of the vacuum chamber 110 may be filled with a predetermined gas atmosphere. For example, argon (Ar), nitrogen ($N_2$), oxygen ($O_2$), or the like is prepared in a gas container 131. The gas flow can be controlled by a flow control device 132, and the internal pressure of the vacuum chamber 110 can be controlled by a pressure gauge 135.

The substrate heater 116 is an infrared lamp, for example, and heats a lens sample 10 to extract gas or drive off moisture, thereby securing adhesion of layers formed on the surface of the lens sample 10.

Accordingly, in the deposition apparatus 100, the main deposition conditions are the material to be deposited, the accelerating voltage and current of the electron gun, and whether ion assist is employed. In the case of ion-assisted deposition, the conditions are determined by the kind of ions (the atmosphere in the vacuum chamber 110) and the voltage and the current of the ion gun 118. Hereinafter, unless otherwise noted, the accelerating voltage and current of an electron gun are selected from a range of 5 to 10 kV and a range of 50 to 500 mA, respectively, based on the rate of film formation, etc. In the case of ion-assisted deposition, the voltage and the current of the ion gun 118 are selected from a range of 200 V to 1 kV and a range of 100 to 500 mA, respectively, based on the rate of film formation, etc.

2.1.2.2 Formation of Low-Refractive-Index Layer, High-Refractive-Index Layer, and Silicide Layer The lens sample 10 having the hard coating layer 2 is washed with acetone, and then heat-treated in the vacuum chamber 110 at about 70° C. to evaporate moisture adhering to the lens sample 10. Subsequently, ion cleaning was applied to the surface of the lens sample 10. Specifically, using the ion gun 118, an oxygen ion beam was applied with an energy of several hundred electron volts to the surface of the lens sample 10 to remove organic substances adhering to the surface of the lens sample 10. This can enhance the adhesion of a film formed on the surface of the lens sample 10. In place of oxygen ions, an inert gas, such as Ar, xenon (Xe), or $N_2$, may also be used to give the same treatment. Oxygen radicals and oxygen plasma may also be applied.

The vacuum chamber 110 was adequately evacuated, and then, by electron-beam vacuum deposition, low-refractive-index layers 31 and high-refractive-index layers 32 were alternately laminated, thereby giving an antireflection layer 3.

In the lens sample S1 of Example 1 (hereinafter, the sample of each example is called sample S1, while a common sample is called sample 10), silicon dioxide ($SiO_2$) layers were formed as the low-refractive-index layers 31, and zirconium oxide ($ZrO_2$) layers were formed as the high-refractive-index layers 32.

Low-Refractive-Index Layer

As shown in FIG. 1, the first layer and the third layer are the low-refractive-index layers 31. The $SiO_2$ layers were formed by non-ion-assisted vacuum deposition. The rate of film formation was 2.0 nm/sec.

High-Refractive-Index Layer

The second layer and the fourth second layer are the high-refractive-index layers 32. A tablet-form $ZrO_2$ sintered compact was heated and evaporated by an electron beam, thereby forming the $ZrO_2$ layers. The rate of film formation was 0.8 nm/sec.

Silicide Layer

Figure 3A:
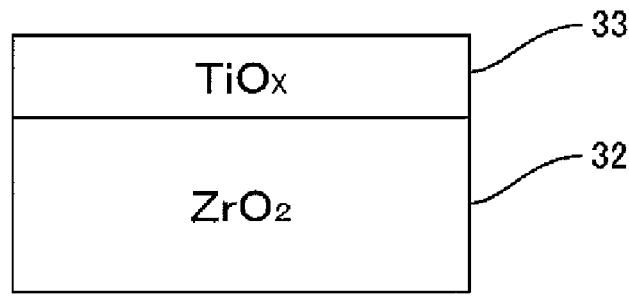
FIG. 3A shows a $ZrO_2$ layer with $TiO_x$ deposited thereon.
Figure 3B:
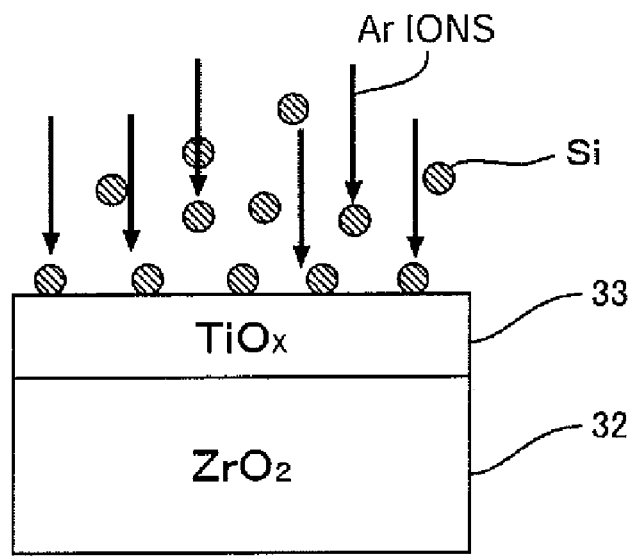
FIG. 3B shows the implantation (addition) of Si (metal silicon) into the $TiO_x$ layer by ion-assisted deposition.
Figure 3C:
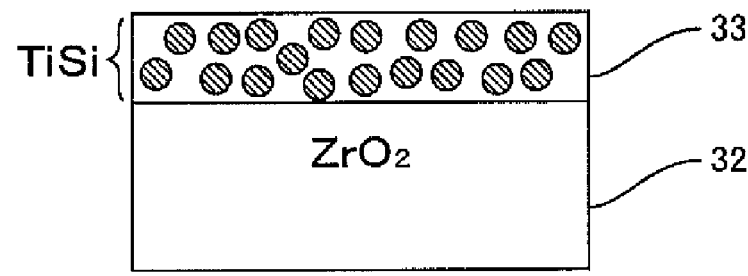
FIG. 3C shows a silicide layer formed as a result of the addition of Si (metal silicon).

After forming the first layer 31, the second layer 32, the third layer 31, and the fourth layer 32 on the lens sample 10, as shown in FIGS. 3A to 3C, a silicide layer (electrically conductive layer, silicide layer: TiSi) 33 was formed as the fifth layer using the deposition apparatus 100. The silicide layer 33 was formed as follows. A $TiO_x$ sintered compact material was heated by an electron beam and thereby evaporated, and a film of $TiO_x$ was formed by non-ion-assisted vacuum deposition (FIG. 3A). Then, Si (metal silicon) was implanted from above into the layer of $TiO_x$ by ion-assisted deposition using argon ions (FIG. 3B). As a result of ion-assisted deposition using argon ions, Si (metal silicon) atoms are mixed into the pre-deposited $TiO_x$ layer and undergo chemical reaction, thereby forming the silicide layer (TiSi) 33 (FIG. 3C). In Example 1, the silicide layer (TiSi) was formed to a thickness of 3 nm. Although an example using $TiO_x$ is given above, $TiO_2$ may also be used in place of $TiO_x$.

The conditions of the ion-assisted deposition for forming the film of Si (metal silicon) are as follows: kind of ions: argon, ion-assisted voltage: 1000 eV, current: 200 mA, deposition time: 10 seconds.

Low-Refractive-Index Layer

An $SiO_2$ layer was formed on the silicide layer 33 under the same conditions as in the production of the first and third layers. The rate of film formation was 2.0 nm/sec, and the accelerating voltage and current of the electron gun were 7 kV and 100 mA, respectively.

In these processes, the thicknesses of the first to sixth layers were controlled at 150 nm, 30 nm, 21 nm, 55 nm, 3 nm, and 85 nm, respectively. Such, a layer structure consisting of six layers, i.e., the structure in which the first layer, the third layer, and the sixth layer are low-refractive-index layers 31 of $SiO_2$, the second layer and the fourth layer are high-refractive-index layers 32 of $ZrO_2$, and the fifth layer is a silicide layer 33, is hereinafter called the layer structure of type A1.

2.1.3 Formation of Antifouling Layer

After forming the antireflection layer 3, oxygen plasma treatment was performed. Then, in the vacuum chamber 110, a pellet material, containing "KY-130" (trade name, manufactured by Shin-Etsu Chemical) that contains a high-molecular-weight, fluorine-containing organosilicon compound was heated as a deposition source at about 500° C. to evaporate KY-130, thereby forming an antifouling layer 4. The deposition time was about 3 minutes. Oxygen plasma treatment allows the generation of silanol groups on the surface of the last $SiO_2$ layer, so the chemical adhesion (chemical bond) between the antireflection layer 3 and the antifouling layer 4 can be improved. After the completion of deposition, the lens sample 10 was removed from the vacuum deposition apparatus 100, reversed, and replaced into the apparatus. The processes of 2.1.2 to 2.1.3 above were repeated in the same manner, thereby forming an antireflection layer, a silicide layer, and an antifouling layer. Subsequently, the lens sample 10 was removed from the vacuum deposition apparatus 100, thereby giving a lens sample S1 of Example 1. The lens sample S1 has, on each side of the lens substrate 1, the hard coating layer 2, the antireflection layer 3 of type A1 including the silicide layer, and the antifouling layer 4.

2.2 Example 2

Sample S2

Using the same lens substrate 1 as above, a hard coating layer 2 was formed under the same conditions, and an antireflection layer 3 of type A1 was formed on the surface thereof, thereby giving a sample S2. Low-refractive-index layers 31 and high-refractive-index layers 32 were formed under the same conditions as in Example 1 (2.1.2.2). However, in the formation of a silicide layer (fifth layer) 33, a TiSi compound was employed as a deposition source, and the silicide layer 33 was formed by non-ion-assisted vacuum deposition. The silicide layer 33 of the sample 52 was formed to a thickness of 1 nm. After forming the antireflection layer 3, an antifouling layer 4 was formed in the same manner as in Example 1 (see 2.1.3).

2.3 Comparative Example 1

Sample R1

Using the same lens substrate 1 as in Example 1, a hard coating layer 2 was formed under the same conditions, and an antireflection layer 3 was formed on the surface thereof, thereby giving a sample R1. Low-refractive-index layers 31 and high-refractive-index layers 32 were formed under the same conditions as in 2.1.2 above.

Further, as the fifth layer (electrically conductive layer), only Si (metal silicon) was deposited by non-ion-assisted deposition to a thickness of 3 nm. That is, after forming the fourth layer ($ZrO_2$ layer), a film of Si (metal silicon) was formed by vacuum deposition to form a layer of amorphous silicon. Accordingly, the antireflection layer 3 has a six-layer structure including the amorphous silicon layer. Such a six-layer structure including an amorphous silicon layer is hereinafter called type A3.

After forming the antireflection layer 3, an antifouling layer 4 was formed in the same manner as in Example 1 (see 2.1.3). Accordingly, the lens sample R1 produced in Comparative Example 1 has the plastic lens substrate 1, the hard coating layer 2, the antireflection layer 3 of type A3 including the amorphous silicon layer as the fifth layer (electrically conductive layer) 33, and the antifouling layer 4.

2.4 Comparative Example 2

Sample R2

Using the same lens substrate 1 as in Example 1, a hard coating layer 2 was formed under the same conditions, and an antireflection layer 3 was formed on the surface thereof, thereby giving a sample R2. Low-refractive-index layers 31 and high-refractive-index layers 32 were formed under the same conditions as in 2.1.2 above.

Further, as the fifth layer (electrically conductive layer), a film of indium tin oxide (ITO) was formed by ion-assisted vacuum deposition. That is, after forming the fourth layer ($ZrO_2$ layer) 32, a film of ITO was formed by ion-assisted vacuum deposition to a thickness of 3 nm, thereby forming an ITO layer as the fifth layer (electrically conductive layer) 33. At the time of forming the ITO layer, the accelerating voltage and current of the electron gun were 7 kV and 50 mA, respectively, and, in order to accelerate the oxidation of the ITO film, oxygen gas was introduced into the vacuum chamber at 15 ml/min to create an oxygen atmosphere. In addition, oxygen gas was introduced into the ion gun at 35 ml/min, and, with a voltage of 500 V and a current of 250 mA, an oxygen ion beam was applied. A $SiO_2$ layer was then formed thereon as the sixth layer. Accordingly, the antireflection layer 3 including the ITO layer has a six-layer structure.

Such a six-layer structure including an ITO layer is hereinafter called type A4. After forming the antireflection layer 3, an antifouling layer 4 was formed in the same manner as in Example 1 (see 2.1.3). Accordingly, the lens sample R2 produced in Comparative Example 2 has the plastic lens substrate 1, the hard coating layer 2, the antireflection layer 3 of type A4 including the ITO layer, and the antifouling layer 4.

The layer structures of Example 1, Example 2, and Comparative Examples 1 and 2 are summarized in FIG. 4. The refractive index n of the low-refractive-index layer of silicon dioxide ($SiO_2$) at a wavelength of 550 nm is 1.462. The refractive index n of the high-refractive-index layer of zirconium oxide ($ZrO_2$) at a wavelength of 550 nm is 2.05. The refractive index n of the ITO layer at a wavelength of 550 nm is 2.1. The amorphous silicon does not have to consist of pure Si, and may be slightly oxidized.

2.5 Evaluation of Samples

The sheet resistances of the above-obtained samples S1, S2, R1, and R2 were measured. The measurement results are summarized in FIG. 4.

2.5.1 Sheet Resistance

Figure 5A:
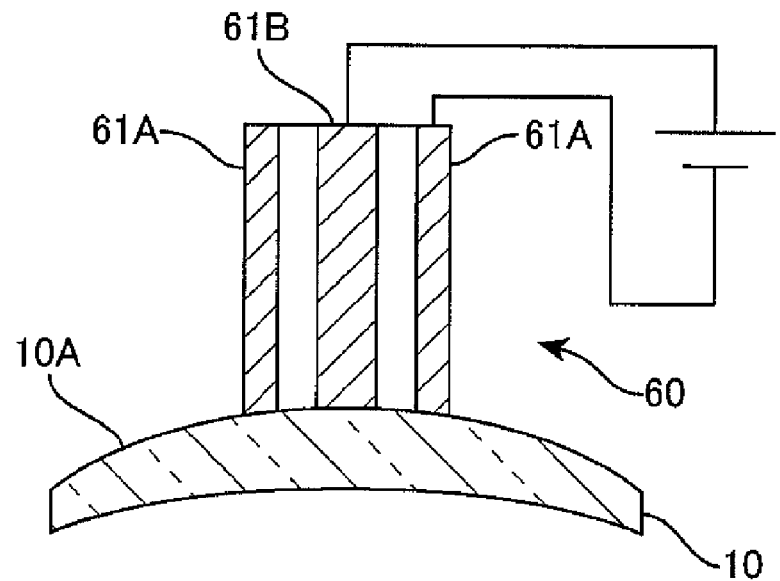
Figure 5B:
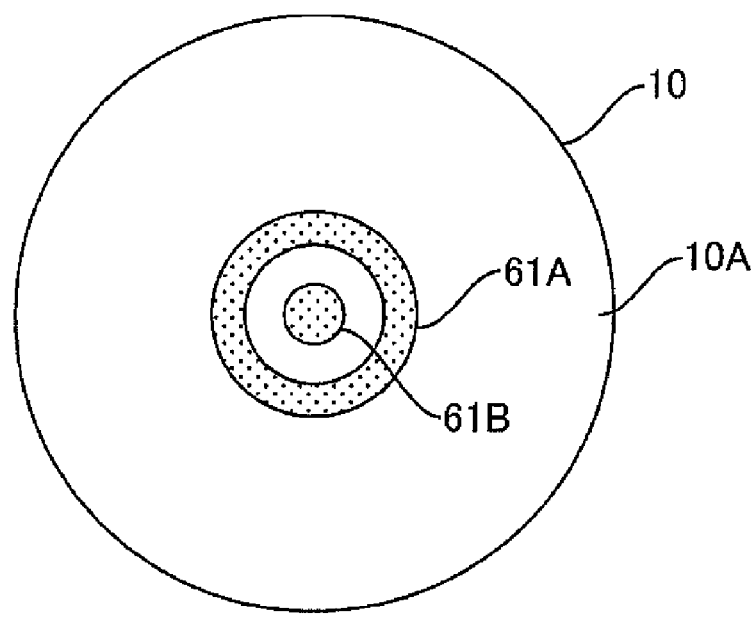
FIG. 5B is a plan view.

FIGS. 5A and 5B show measurement of the sheet resistance of each sample. In this example, a ring probe 61 was brought into contact with the subject of measurement, for example, the surface 10A of a lens sample 10, to measure the sheet resistance of the surface 10A of the lens sample 10. As a measuring apparatus 60, a high-resistance resistivity meter Hiresta UP MCP-HT450 manufactured by Mitsubishi Chemical Corporation was used. The ring probe 61 used is a URS probe and has two electrodes. The exterior ring electrode 61A has an outer diameter of 18 mm and an inner diameter of 10 mm, and the interior, circular electrode 61B has a diameter of 7 mm. A voltage of 10 to 1 kV was applied between the electrodes, and the sheet resistance of each sample was measured.

2.6 Discussion

FIG. 4 shows the measurement results. The sheet resistance values of the lens samples S1 and S2 having a silicide layer in the antireflection layer 3 were $7\times10^9$ [$\Omega$/sq] and $1\times10^{10}$ [$\Omega$/sq], respectively. The sheet resistance values of the lens sample R1 having a Si (metal silicon) layer in the antireflection layer 3 and the lens sample R2 having an ITO layer in the antireflection layer 3 were $9\times10^{12}$ [Ω/sq] and $2\times10^{12}$ [Ω/sq], respectively. As compared with the sheet resistance of the lens samples R1 and R2, the sheet resistance of the lens samples S1 and S2 is smaller by about two or three orders of magnitude ($10^2$ to $10^3$). That is, the sheet resistance thereof is $\frac{1}{10^2}$ to $\frac{1}{10^3}$ the sheet resistance of the lens samples R1 and R2. This therefore shows that when a silicide layer 33 is included, the sheet resistance of the antireflection layer 3 can be greatly reduced, and also that a silicide layer 33 having a thickness of about 3 nm or less, preferably about 1 nm, is effective in improving the electrical conductivity of the surface of an optical substrate having the antireflection layer 3.

Reduction in the sheet resistance of an optical article provides some advantages such as an antistatic effect and an electromagnetic shielding effect. In a spectacle lens, a sheet resistance of not more than $1\times10^{12}$ [Ω/sq] is thought to be an index of the presence of antistatic properties. Considering safety in use, etc., the sheet resistance as measured by the above measurement method is more preferably not more than $1\times10^{11}$ [Ω/sq]. As measured by the above measurement method, the samples S1 and S2 have a sheet resistance of not more than $1\times10^{11}$ [Ω/sq], even not more than $1\times10^{10}$ [Ω/sq], which indicates that these samples have extremely excellent antistatic properties.

As shown in FIG. 3B, Si (metal silicon) is applied to the surface of a $TiO_x$ layer by ion-assisted deposition with appropriate energy, whereby, as shown in FIG. 3A, Si (metal silicon) atoms are not only applied to the surface of the $TiO_x$ layer but also slightly implanted (added) into a depth of approximately 1 nm or more from the surface of the $TiO_x$ layer, and mixed with $TiO_x$. That is, Si (metal silicon) atoms are driven (implanted) into the $TiO_x$ layer, chemically react with $TiO_x$, the material of the base, and thereby make a modification in the vicinity of the surface. As a result, Ti atoms in the $TiO_x$ layer react with the Si (metal silicon) atoms, presumably forming titanium silicide, an intermetallic compound, such as TiSi or $TiSi_2$. The resistivity of titanium silicide (e.g., $TiSi_2$) is as low as 15 to 20 μΩ·cm (sheet resistance (20 nm) is 12 to 18 Ω/sq), and the chemical resistance thereof is also high, as it is hardly soluble except for the case of HF. Further, titanium silicide is reactive with an oxide film ($SiO_2$), so adhesion with an additional oxide film laminated on the $ZrO_2$ layer can also be secured.

Accordingly, titanium silicide may exist over the entire surface of the $ZrO_2$ layer or in localized areas, or alternatively, a silicide may exist as an oxide of titanium silicide. The presence of the silicide layer 33 will reduce the sheet resistance of the antireflection layer 3 and improve the electrical conductivity. For this reason, the silicide layer 33 is not limited to the fifth layer of the six-layer structure and may be any layer. Further, it is also possible to form silicide layers on a plurality of layers.

Not only titanium silicide but also other transition metal silicides are generally of low resistance, and also have high affinity with an antireflection layer containing a large quantity of silicon or a silicon-containing compound. Accordingly, it is also effective to form a silicide layer by introducing/mixing Si (metal silicon) atoms into a metal oxide layer other than the $ZrO_2$ layer or the $TiO_2$ layer by ion-assisted deposition or a like method, such as ordinary vacuum deposition, ion plating, or sputtering. The silicide layer 33 may also be formed, after forming an Si layer or an $SiO_2$ layer, by introducing/mixing transition metal atoms, such as Ti atoms, into the surface of the low-refractive-index $SiO_2$ layer by ion-assisted deposition or a like method. Further, as in the above Example 2, a silicide layer may also be formed by introducing/mixing a silicide, such as $TiSi_2$, itself by deposition or a like method.

Other examples of silicides are ZrSi, CoSi, WSi, MoSi, NiSi, TaSi, NdSi, $Ti_3Si$, $Ti_5Si_3$, $Ti_5Si_4$, TiSi, $TiSi_2$, $Zr_3Si$, $Zr_2Si$, $Zr_5Si_3$, $Zr_3Si_2$, $Zr_5Si_4$, $Zr_6Si_5$, $ZrSi_2$, $Hf_2Si$, $Hf_5Si_3$, $Hf_3Si_2$, $Hf_4Si_3$, $Hf_5Si_4$, HfSi, $HfSi_2$, $V_3Si$, $V_5Si_3$, $V_5Si_4$, $VSi_2$, $Nb_4Si$, $Nb_3Si$, $Nb_5Si_3$, $NbSi_2$, $Ta_{4.5}Si$, $Ta_4Si$, $Ta_3Si$, $Ta_2Si$, $Ta_5Si_3$, $TaSi_2$, $Cr_3Si$, $Cr_2Si$, $Cr_5Si_3$, $Cr_3Si_2$, CrSi, $CrSi_2$, $Mo_3Si$, $Mo_5Si_3$, $Mo_3Si_2$, $MoSi_2$, $W_3Si$, $W_5Si_3$, $W_3Si_2$, $WSi_2$, $Mn_6Si$, $Mn_3Si$, $Mn_5Si_2$, $Mn_5Si_3$, MnSi, $Mn_{11}Si_{19}$, $Mn_4Si_7$, $MnSi_2$, $Tc_4Si$, $Tc_3Si$, $Tc_5Si_3$, TcSi, $TcSi_2$, $Re_3Si$, $Re_5Si_3$, ReSi, $ReSi_2$, $Fe_3Si$, $Fe_5Si_3$, FeSi, $FeSi_2$, $Ru_2Si$, RuSi, $Ru_2Si_3$, OsSi, $Os_2Si_3$, $OsSi_2$, $OSSi_{1.8}$, $OsSi_3$, $CO_3Si$, $CO_2Si$, $CoSi_2$, $Rh_2Si$, $Rh_5Si_3$, $Rh_3Si_2$, RhSi, $Rh_4Si_5$, $Rh_3Si$, $RhSi_2$, $Ir_3Si$, $Ir_2Si$, $Ir_3Si_2$, IrSi, $Ir_2Si_3$, $IrSi_{1.75}$, $IrSi_2$, $IrSi_3$, $Ni_3Si$, $Ni_5Si_2$, $Ni_2Si$, $Ni_3Si_2$, $NiSi_2$, $Pd_5Si$, $Pd_9Si_2$, $Pd_4Si$, $Pd_3Si$, $Pd_9Si_4$, $Pd_2Si$, PdSi, $Pt_4Si$, $Pt_3Si$, $Pt_5Si_2$, $Pt_{12}Si_5$, $Pt_7Si_3$, $Pt_2Si$, $Pt_6Si_5$, and PtSi.

Among them, in addition to titanium silicide, useful silicides are zirconium silicide (Zr), tantalum silicide (Ta) neodymium silicide (Nd), niobium silicide (Nb), and the like often used for a high-refractive-index layer in the antireflection layer. Further, silicides having extremely low resistivity as titanium silicide, such as cobalt silicide and nickel silicide, are also useful.

The above experiments have proven that the introduction of a silicide layer reduces surface resistivity. As shown in the following, additional samples were produced and tested for durability, etc.

3. OTHER SAMPLES (GROUP A)

3.1 Example 3

Sample S3

Using a cover glass as the lens substrate 1, an antireflection layer 3 was formed on the surface thereof, thereby giving a sample S3 of Example 3. The cover glass sample (glass sample) S3 has a transparent clear glass (B270) as the optical substrate 1, and the antireflection layer 3 was formed directly on the optical substrate 1 without forming a hard coating layer. The antireflection layer has the six-layer structure of type A1. That is, the first layer, the third layer, and the sixth layer are low-refractive-index layers 31 of $SiO_2$, the second layer and the fourth layer are high-refractive-index layers 32 of $ZrO_2$, and the fifth layer is a silicide layer 33. The low-refractive-index layers 31 of $SiO_2$ and the high-refractive-index layers 32 of $ZrO_2$ were formed under the same conditions as in Example 1 (2.1.2.2). Meanwhile, the silicide layer 33 was formed under the same conditions as in Example 2 (2.2). The glass sample S3 thus has the antireflection layer 3 of type A1. Further, an antifouling layer 4 was formed on the antireflection layer 3.

3.2 Examples 4 to 9

Samples S4 to S9

Lens samples having a lens substrate and glass samples having a cover glass were produced employing different silicide-layer-forming conditions than in Example 1 (2.1.2.2.), thereby giving samples S4 to S9. These samples each have a silicide layer 33 as the fifth layer. The lens samples were produced in the same manner as in Example 1, and the glass samples were produced in the same manner as in Example 3, except that the silicide layer 33 was formed under different conditions.

3.2.1 Examples 4 and 5

Lens Sample S4 and Glass Sample S5

After forming the fourth layer ($ZrO_2$ layer), Si (metal silicon) was applied by ion-assisted deposition using argon ions to silicide the surface layer of the fourth layer ($ZrO_2$ layer), thereby forming a silicide layer (ZrSi in this example) 33. The conditions of the ion-assisted deposition are as follows: kind of ions: argon, ion-assist voltage: 1000 eV, current: 150 mA, ion-assisted deposition time: 10 seconds.

Figure 6A:
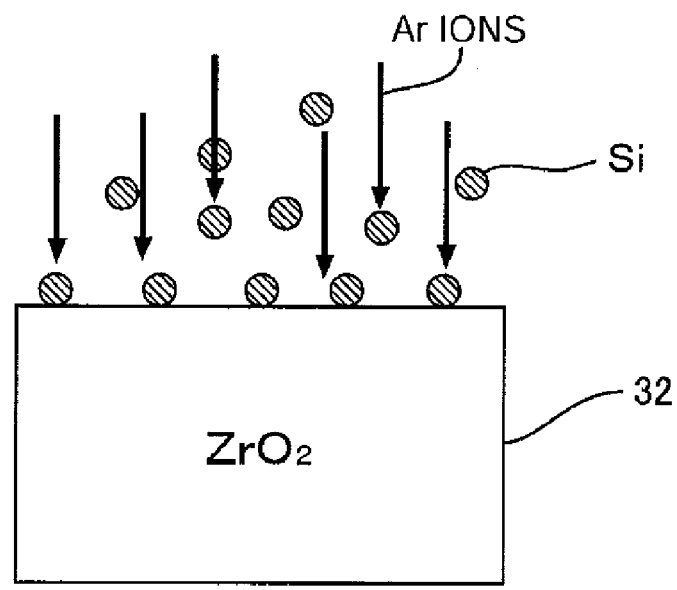
FIG. 6A shows the implantation (addition) of Si (metal silicon) into a $ZrO_2$ layer by ion-assisted deposition.
Figure 6B:
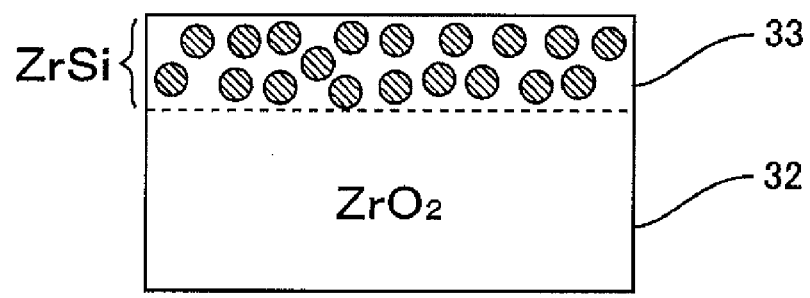
FIG. 6B shows a silicide layer formed as a result of the addition of Si (metal silicon).

As shown in FIG. 6A, when Si (metal silicon) is deposited on the fourth layer ($ZrO_2$) 32 by ion-assisted deposition using argon ions, due to the mixing effect, Si (metal silicon) atoms chemically react with Zr in a certain region of the $ZrO_2$ layer, whereby the silicide (ZrSi) layer 33 is formed, as shown in a FIG. 6B. As zirconia silicide formed by chemical reaction between Zr and Si (metal silicon) in the base layer, at least one of $ZrSi$, $Zr_3Si$, $Zr_2Si$, $Zr_5Si_3$, $Zr_3Si_2$, $Zr_5Si_4$, $Zr_6Si_5$, and $ZrSi_2$ will be present.

3.2.2 Examples 6 and 7

Lens Sample S6 and Glass Sample S7

As pretreatment for forming a silicide layer 33, a $TiO_x$ layer having a thickness of about 1 nm was formed on the surface of the fourth layer ($ZrO_2$ layer) by ordinary vacuum deposition. Subsequently, Si (metal silicon) was added thereto by ion-assisted deposition to cause silicidation. The ion-assisted deposition was performed under the following conditions: kind of ions: argon, ion-assisted voltage: 500 eV, current: 150 mA, deposition time (ion-assisted deposition time): 10 seconds.

3.2.3 Examples 8 and 9

Lens Sample S8 and Glass Sample S9

As pretreatment for forming a silicide layer 33, a $TiO_x$ layer having a thickness of about 1 nm was formed on the surface of the fourth layer ($ZrO_2$ layer) by ordinary vacuum deposition. Subsequently, Si (metal silicon) was added thereto by ion-assisted deposition to cause silicidation. The ion-assisted deposition was performed under the following conditions: kind of ions argon and oxygen at 1:1, ion-assisted voltage: 250 eV, current: 150 mA, deposition time: 10 seconds.

3.3 Comparative Example 3

Sample R3

In addition to the above Comparative Examples 1 and 2 (lens samples R1 and R2), a glass sample R3 having no silicide layer was produced for comparison with the glass samples obtained in the above examples. Except for that, the glass sample R3 was produced in the same manner as in Example 3. That is, the glass sample R3 produced in Comparative Example 3 has a glass substrate 1 and an antireflection layer 3 of five-layer structure including no silicide layer ($SiO_2$ layer, $ZrO_2$ layer, $SiO_2$ layer, $ZrO_2$ layer, and $SiO_2$ layer; hereinafter referred to as type A2). The glass sample R3 also has an antifouling layer 4 formed on the antireflection layer 3.

The layer structure is shown in FIG. 7, together with the structures of the sample S1, the sample S2, the sample R1, and the sample R2.

3.4 Evaluation of Samples

The above-obtained samples S1 to S9 and R1 to R3 were evaluated for sheet resistance, dust adhesion, absorption loss, chemical resistance (presence/absence of separation), and moisture resistance (presence/absence of swelling). The evaluation results are summarized in FIG. 8.

3.4.1 Sheet Resistance

The sheet resistance of each sample was measured by the measurement method described in 2.5.1 above. As the measurement result for the sample R3 shows, the sheet resistance of a conventional glass sample is $5 \times 10^{14}$ [Ω/sq]. In contrast, the sheet resistance of the samples S1 to S9 having a silicide layer formed as a layer of the antireflection layer 3 is $2 \times 10^9$ [Ω/sq] to $8 \times 10^{11}$ [Ω/sq], which is smaller by about three to five orders of magnitude ($10^3$ to $10^5$) as compared with the conventional sample. That is, the sheet resistance thereof is $1/10^3$ to $1/10^5$ the sheet resistance of the conventional sample, indicating improved electrical conductivity. It was therefore confirmed that sheet resistance is greatly reduced by forming a silicide layer, whereby electrical conductivity is improved. Moreover, as measured by the above measurement method, the samples S1 to S9 have a sheet resistance of not more than $1 \times 10^{12}$ [Ω/sq], indicating that they have excellent antistatic properties.

On the other hand, as shown in FIG. 8, with respect to the lens samples R1 and R2 having an amorphous silicon layer or an ITO layer in the antireflection layer 3, the sheet resistance values thereof are $9 \times 10^{12}$Ω and $2 \times 10^{12}$Ω, respectively, which are not sufficiently low to provide excellent antistatic performance.

3.4.2 Dust Adhesion Test

The surface of a plastic lens was subjected to ten double rubs with a glasses-cleaning cloth under a vertical load of 1 kg, and dust adhesion due to the thus-generated static electricity was observed. Pieces of Styrofoam broken to a diameter of 2 to 3 mm were used as the dust herein. The criteria are as follows.

Good: no dust adhesion was observed.
Fair: adhesion of some dust was observed.
Poor: adhesion of a large amount of dust was observed.

When no dust adheres to the surface, the sample has an excellent antistatic effect, while when any dust adheres, the sample has a poor antistatic effect. As shown in FIG. 8, the evaluation results for the samples S1 to S9 having a silicide layer were all Good, indicating that they have an excellent antistatic effect. The results for the sample R1 having an amorphous silicon layer and the sample R3 having no electrically conductive layer were Poor, indicating that they have an inferior antistatic effect. The result for the sample R2 having an ITO layer was Fair.

3.4.3 Absorption Loss

Optical absorption loss was measured. Measurement of optical absorption loss is difficult when the surface is curved, for example. Therefore, among the above samples S1 to S9 and R1 to R3, the glass samples S3, S5, S7, and S9 were measured for absorption loss, and the results were compared with the absorption loss of the glass sample R3.

A spectrophotometer U-4100 manufactured by HITACHI was used for the measurement of optical absorption loss. Reflectivity and transmittance were measured using the spectrophotometer, and absorbance was calculated by the formula (A):

Absorbance (absorption loss)=100%−transmittance−reflectivity     (A).

Absorbance mentioned hereinafter indicates absorbance near a wavelength of 550 nm.

With respect to optical absorption loss, there is a tendency for absorption loss to slightly increase when a silicide layer is present. However, the loss is about 1.2% at most, and thus the light transmittance is within the allowable range as a spectacle lens. Further, when antistatic performance is taken into consideration, the sample S9 with an absorption loss of 0.4% or the sample S3 with an absorption loss of 0.5% may be employed to provide a reduced sheet resistance of not more than $3 \times 10^{10}$ [Ω/sq]. This therefore shows that the formation of a silicide layer makes it possible to provide an optical article that exhibits a substantially conventional absorption loss and has improved light transmittance and antistatic performance.

3.4.4 Chemical Resistance

Scratches were created on the surface of each sample. The samples were then immersed in a chemical solution. The presence of separation of the antireflection layer was observed to evaluate chemical resistance.

(1) Abrasion Process

As shown in FIG. 9B, four samples 10 for evaluation are attached to the inner wall of a container (drum) 71 shown in FIG. 9A. For abrasion, pieces of nonwoven fabric 73 and sawdust 74 are placed therein. The lid is then closed, and the drum 71 is rotated at 30 rpm for 30 minutes as shown in FIG. 10.

(2) Chemical Solution Immersion Process

A chemical solution resembling human sweat (solution of lactic acid and salt dissolved in purified water at 50 g/L and 100 g/L, respectively) was prepared. After the abrasion process of (1) above, the treated samples 10 were immersed in the chemical solution maintained at 50° C. for 100 hours.

(3) Evaluation

The samples that went through the above processes were visually observed with reference to the conventional sample R3. The criteria are as follows.

Good: As compared with the reference sample, scratches are hardly observable, and the transparency is comparable.

Fair: As compared with the reference sample, scratches are more apparent, and the transparency is inferior.

Poor: As compared with the reference sample, layer separation has occurred, a number of scratches are observed, and the transparency is significantly lower.

With respect to chemical resistance, the evaluation results for the samples S1 to S9 having a silicide layer were all Good, indicating that they have excellent chemical resistance in an ordinary environment. Meanwhile, the evaluation result for the sample R2 having an ITO layer was Poor.

3.4.5 Evaluation of Swelling (Moisture Resistance)

(1) Constant Temperature and Humidity Environmental Test

Each sample was allowed to stand in a constant temperature and humidity environment (60° C., 98% RH) for 8 days.

(2) Method for Determination of Swelling

Figure 12A:
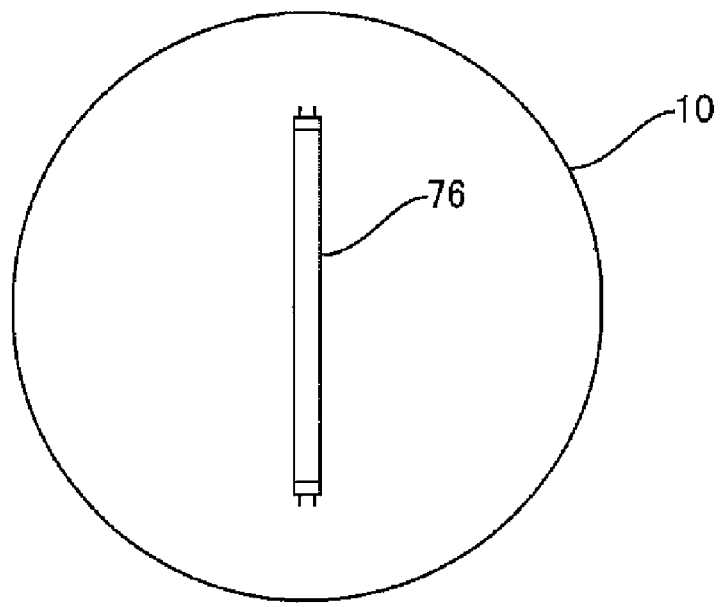
FIG. 12A schematically shows a lens surface without swelling, and FIG. 12B schematically shows a lens surface with swelling.
Figure 12B:
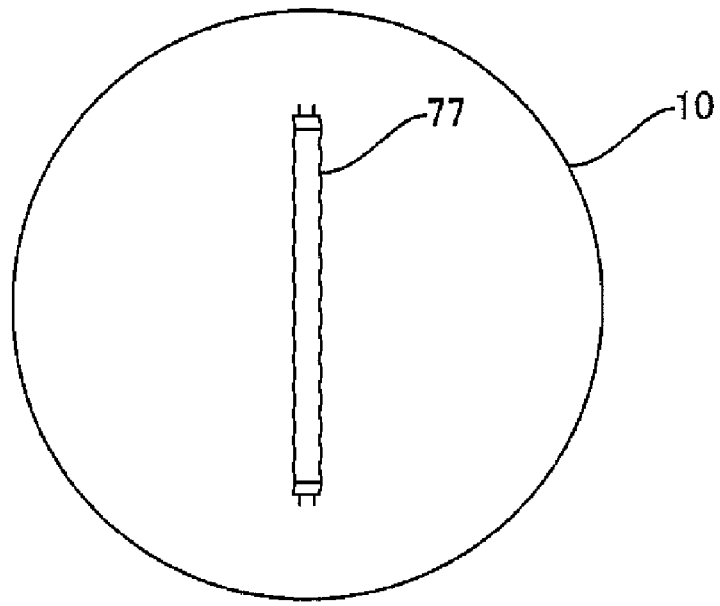

After the above constant temperature and humidity environmental test, the surface reflected light from the front side or the rear side of each treated sample was observed to determine the presence of swelling. Specifically, as shown in FIG. 11, the light of a fluorescent lamp 75 reflected from the convex surface 10A of each sample 10 was observed. As shown in FIG. 12A, when the outline of the image of the reflected light 76 of the fluorescent lamp 75 was clear and distinct, swelling was determined to be "absent". As shown in FIG. 12B, when the outline of the image of the reflected light 77 of the fluorescent lamp 75 was indistinct or blurred, swelling was determined to be "present".

In all the samples including the samples S1 to S9 having a silicide layer, no swelling was observed, indicating that they have excellent moisture resistance.

3.5 Discussion

The above evaluation results show that the samples S1 to S9 having a silicide layer in the antireflection layer 3 serve as optical articles that have greatly reduced sheet resistance with no degradation in chemical resistance or moisture resistance, also have antistatic characteristics, etc., and further have high durability. This therefore shows that an optical article with excellent antistatic performance and electromagnetic shielding performance can be provided.

In the above examples, the silicide layers are formed by a method in which a $TiO_x$ layer is deposited on a zirconium oxide ($ZrO_2$) layer, followed by ion-assisted deposition of Si (metal silicon); a method in which a TiSi compound is deposited directly on a zirconium oxide ($ZrO_2$) layer; or a method in which Si (metal silicon) is implanted into a zirconium oxide ($ZrO_2$) layer by ion-assisted deposition. However, the method for forming a silicide layer is not limited thereto. Further, the structure of the antireflection layer is not limited to one including a $ZrO_2$ layer.

The following explains, as examples of other silicides, samples having a titanium silicide (TiSi) layer formed in an antireflection layer 3 that includes $SiO_2$ layers as low-refractive-index layers and $TiO_2$ layers as high-refractive-index layers.

4. SAMPLES HAVING $SiO_2$—$TiO_2$ ANTIREFLECTION LAYER (GROUP B)

4.1 Example 10

Sample S10

4.1.1 Production of Sample S10

In the same manner as in the above Example 1, a lens substrate 1 was selected, and a hard coating layer 2 was formed (see 2.1.1). Further, using the same deposition apparatus 100 as in Example 1, the following antireflection layer 3 was formed. In the lens sample S10 of Example 10, silicon dioxide ($SiO_2$) layers were formed as the low-refractive-index layers 31, and titanium oxide (TiO$_2$) layers were formed as the high-refractive-index layers 32.

Low-Refractive-Index Layer

Figure 13:
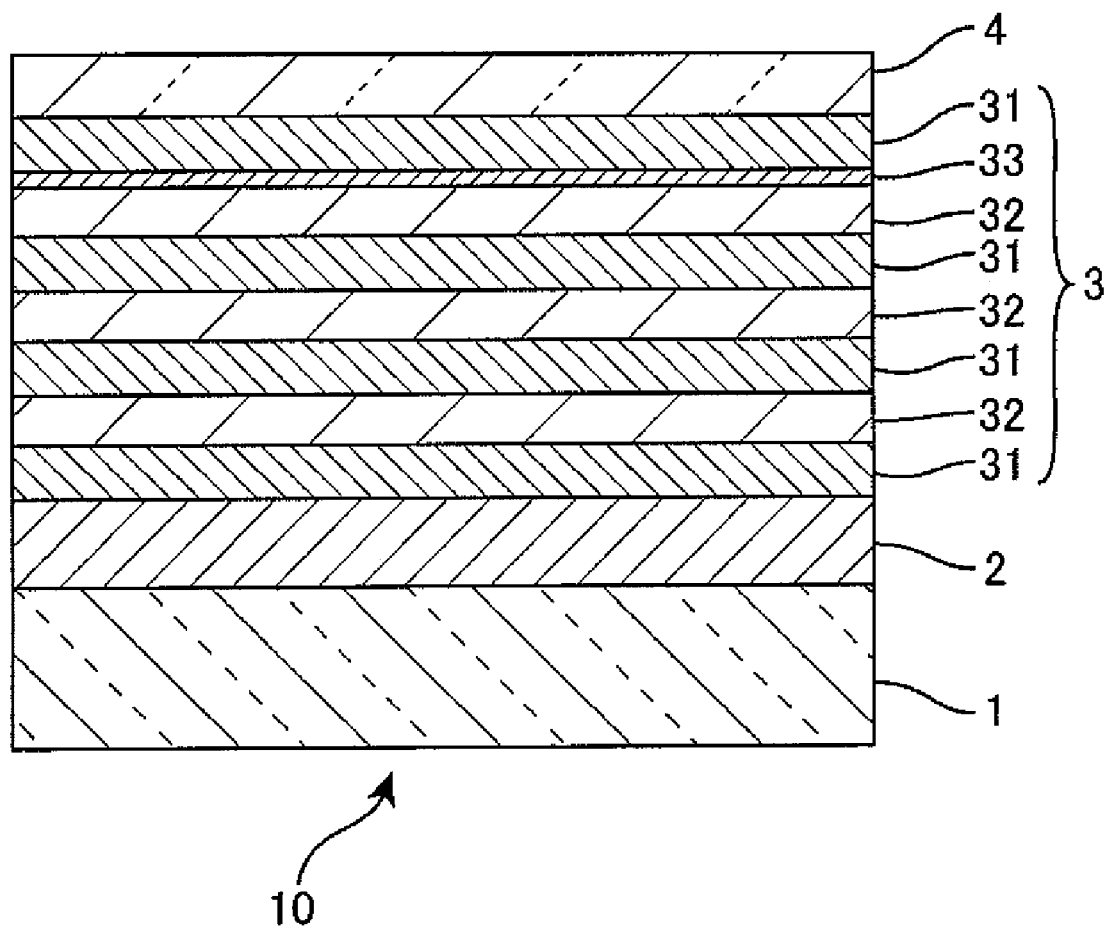
FIG. 13 is a sectional view of a lens that has an antireflection layer having the layer structure of group B.

As shown in FIG. 13, the first layer, the third layer, and the fifth layer are the low-refractive-index layers 31. The SiO$_2$ layers were formed by non-ion-assisted vacuum deposition of SiO$_2$. The rate of film formation was 2.0 nm/sec, and the accelerating voltage and current of the electron gun were 7 kV and 100 mA, respectively.

High-Refractive-Index Layer

The second layer, the fourth layer, and the sixth layer are the high-refractive-index layers 32. While introducing oxygen gas, TiO$_2$ was deposited by ion-assisted deposition to form a TiO$_2$ layer. The rate of film formation was 0.4 nm/sec, and the accelerating voltage and current of the electron gun were 7 kV and 360 mA, respectively.

Silicide Layer

After forming the sixth layer (TiO$_2$ layer), Si (metal silicon) was deposited by ion-assisted deposition using argon ions to form a silicide layer 33 as the seventh layer. The conditions of the ion-assisted deposition are as follows: kind of ions: argon, ion-assisted voltage: 1000 eV, current: 150 mA, ion-assisted deposition time: 10 seconds. The accelerating voltage and current of the electron gun were 7 kV and 400 mA, respectively.

Low-Refractive-Index Layer

SiO$_2$ was deposited on the silicide layer 33 by vacuum deposition under the same conditions as in the production of the first layer, the third layer, and the fifth layer, thereby forming a low-refractive-index layer 31.

The thicknesses of the first to sixth layers and the eighth layer were controlled at 44 nm, 10 nm, 57 nm, 36 nm, 25 nm, 36 nm, and 101 nm, respectively. The thickness of the silicide layer 33 was controlled by the deposition time. The thickness of the silicide layer 33 is expected to be about 1 to about 5 nm.

Such a layer structure consisting of eight layers, i.e., the structure in which the first layer, the third layer, the fifth layer, and the eighth layer are SiO$_2$ layers, the second layer, the fourth layer, and the sixth layer are TiO$_2$ layers, and the seventh layer is a silicide layer (TiSi), is hereinafter called the layer structure of type B1. After forming the antireflection layer 3, an antifouling layer 4 was formed in the same manner as in Example 1 (see 2.1.3).

4.2 Example 11

Sample S11

Using a cover glass as the lens substrate 1, an antireflection layer 3 was formed on the surface thereof to give a glass sample S11 as an example of an optical article other than a lens. In the glass sample S11, the optical substrate 1 is a transparent clear glass (B270). The antireflection layer 3 was formed directly on the optical substrate 1, without forming a hard coating layer. The method for forming the layer is the same as in 4.1.1 above. Further, as the seventh layer, a silicide layer was formed in the same manner as in 4.1.1 above. The sample S11 thus has the antireflection layer 3 of type B1. Further, an antifouling layer 4 was formed on the antireflection layer 3.

4.3 Examples 12 to 17

Samples S12 to S17

With reference to the lens sample S10 and the cover glass sample (glass sample) S11, samples S12 to S17 were produced by changing the conditions of treatment for forming a silicide layer employed in 4.1.1 above. In the case of the lens sample S12 and the glass sample S13, the conditions of ion-assisted deposition for forming a silicide layer were as follows: kind of ions: argon, ion-assisted voltage: 1000 eV, current: 150 mA, ion-assisted deposition time: 5 seconds. In the case of the lens sample S14 and the glass sample S15, the conditions of ion-assisted deposition for forming a silicide layer were as follows: kind of ions: argon, ion-assisted voltage: 500 eV, current: 150 mA, deposition time: 10 seconds. In the case of the lens sample S16 and the glass sample S17, the conditions of ion-assisted deposition for forming a silicide layer were as follows: kind of ions: argon and oxygen at 1:1, ion-assisted voltage: 250 eV, current: 150 mA, deposition time: 5 seconds.

4.4 Comparative Examples 4 and 5

Samples R4 and R5

For comparison with the lens samples and glass samples obtained in the above examples, a lens sample R4 and a glass sample R5 were produced in the same manner as in Example 10 and Example 11. However, the production of a silicide layer (4.1.1) was not employed. That is, the lens sample R4 produced in Comparative Example 4 has a lens substrate 1, a hard coating layer 2, an antireflection layer 3 of type B2 including no silicide layer, and an antifouling layer 4. The glass sample R5 produced in Comparative Example 5 has a glass substrate 1, and an antireflection layer 3 of type B2 including no silicide layer. The samples R4 and R5 each also have an antifouling layer 4 formed on the antireflection layer 3.

4.5 Comparative Examples 6 to 11

Samples R6 to R11

For comparison with the lens samples obtained in the above examples, lens samples R6 to R11 having a transparent, electrically conductive layer, an ITO (indium tin oxide) layer, were produced. In the production of the lens samples R6 to R11, in the same manner as in the above Example 10, a lens substrate 1 was selected, and a hard coating layer 2 was formed (see 2.1.1). The first to sixth layers and the eighth layer were formed in the same manner as in Example 10. SiO$_2$ layers were formed as the low-refractive-index layers 31, and TiO$_2$ layers were formed as the high-refractive-index layers 32. The thicknesses for the first to sixth layer and the eighth layer are as shown in FIG. 14. For example, in Comparative Example 6, the thicknesses are 28.4, 6.7, 204.3, 23.2, 35.7, 26.7, and 99.5 nm.

Further, after forming the sixth layer (TiO$_2$ layer) a film of indium tin oxide (ITO) was formed by ion-assisted vacuum deposition. At the time of forming the ITO layer, the accelerating voltage and current of the electron gun were 7 kV and 50 mA, respectively, and, in order to accelerate the oxidation of the ITO film, oxygen gas was introduced into the vacuum chamber at 15 ml/min to create an oxygen atmosphere. In addition, oxygen gas was introduced into the ion gun at 35 ml/min, and, with a voltage of 500 V and a current of 250 mA, an oxygen ion beam was applied. The rate of ITO layer formation was 0.1 nm/sec. The thickness of the ITO layer was varied among the samples R6 to R11 to be 2.5, 3.5, 5, 7, 10, and 15 nm, respectively, as shown in FIG. 14. Accordingly, the antireflection layer 3 including the ITO layer has an eight-layer structure. Such an eight-layer structure including an ITO layer is hereinafter called type B3.

Because the ITO film thicknesses vary between Comparative Examples 6 to 11, the design of the antireflection layer 3 also differs. Further, the thicknesses of the SiO$_2$ layer and the TiO$_2$ layer are also different. This gives types B3-1 to B3-6. The structures of the antireflection layers 3 of the samples R6 to R11 are shown in FIG. 14, together with the above-described samples S10 to S17, R4, and R5.

4.6 Evaluation of Samples

In the same manner as in 3.4 above, the samples S10 to 517 and R4 to R11 were evaluated for sheet resistance, dust adhesion, absorption loss, chemical resistance (presence/absence of separation), and moisture resistance (presence/absence of swelling). The evaluation results are summarized in FIG. 15.

As the measurement results for the samples R4 and R5 show, the sheet resistance of a conventional lens sample and a conventional glass sample is $5 \times 10^{13}$ [Ω/sq]. With respect to the lens samples R6 to R11 having an ITO layer in the antireflection layer 3 for the purpose of reducing sheet resistance, although this depends on the ITO layer thickness, the sheet resistance is reduced to $1.5 \times 10^{11}$ [Ω/sq] to $2 \times 10^{13}$ [Ω/sq].

In contrast, the sheet resistance of the samples S10 to S17 having a silicide layer formed as a layer of the antireflection layer 3 is $5 \times 10^7$ [Ω/sq] to $1 \times 10^{10}$ [Ω/sq], which is smaller by about three to six orders of magnitude ($10^3$ to $10^6$) as compared with the conventional samples. That is, the sheet resistance thereof is $1/10^3$ to $1/10^6$ the sheet resistance of the conventional samples. This therefore shows that sheet resistance is greatly reduced by forming a silicide layer.

Further, in comparison with the samples R6 to R11 in which the antireflection layer 3 has an eight-layer structure and includes an ITO layer, the sheet resistance of the samples S10 to S17 is smaller by about one to six orders of magnitude ($10^1$ to $10^6$). The sheet resistance thus is $1/10$ to $1/10^6$ the sheet resistance of the samples R6 to R11. This therefore shows that the reduction in sheet resistance by forming a silicide layer is greater than in the case of samples having an ITO layer.

As shown above, a reduction in the sheet resistance of an optical article, such as a lens or a cover glass, provides some advantages such as an antistatic effect and an electromagnetic shielding effect. In a spectacle lens, a sheet resistance of not more than $1 \times 10^{12}$ [Ω/sq] is thought to be an index of the presence of antistatic properties. According to the dust adhesion test performed simultaneously with the above testing, as shown in FIG. 15, the evaluation results for the samples S10 to S17 having a silicide layer were all Good, indicating that they have an excellent antistatic effect. Further, the results for the samples R8 to R11 having an ITO layer were Good, indicating that they have some antistatic efficacy. However, the result for the sample R7 having an ITO layer was Fair, and the results for the sample R6 having an ITO layer (sheet resistance: $2 \times 10^{13}$ [Ω/sq]) and the samples R4 and R5 having no electrically conductive film (sheet resistance: $5 \times 10^{13}$ [Ω/sq]) were all Poor, indicating that their antistatic effect is inferior.

Considering safety in use, etc., the sheet resistance as measured by the above measurement method is more preferably not more than $1 \times 10^{11}$ [Ω/sq]. As measured by the above measurement method, the samples S10 to S17 have a sheet resistance of not more than $1 \times 10^{11}$ [Ω/sq], even not more than $1 \times 10^{10}$ [Ω/sq], which indicates that these samples have extremely excellent antistatic properties.

There is a tendency for absorption loss to slightly increase when a silicide layer is present. However, the loss is about 3% at most, and the light transmittance is sufficiently high. The increase in optical absorption loss is not so significant, and it does not greatly affect the light transmittance of the antireflection layer 3. Accordingly, the antireflection layer 3 having the layer structure B1 including a silicide layer is sufficient for use as a spectacle lens. Further, when antistatic performance is taken into consideration, the sample S17 with an absorption loss of 0.5%, for example, provides sufficiently reduced sheet resistance. This therefore shows that forming a silicide layer makes it possible to provide an optical article that exhibits a substantially conventional absorption loss, is light-transmissive (transparent), and has excellent antistatic performance.

With respect to chemical resistance, as shown in FIG. 15, the evaluation results for the samples S10 to S17 having a silicide layer were all Good, indicating that they have excellent chemical resistance in an ordinary environment. On the other hand, the results for the samples R6 to R11 having an ITO layer were all Poor, indicating that the presence of the ITO layer reduces the chemical resistance of the samples.

In evaluation of swelling (moisture resistance), as shown in FIG. 15, no swelling was observed in the samples S10 to S17 having a silicide layer, indicating that they have excellent moisture resistance. On the other hand, with respect to the samples R6 to R11 having an ITO layer, an increase in the ITO layer thickness led to swelling. This indicates that the presence of an ITO layer may reduce the moisture resistance of a sample.

4.7 Discussion

The above evaluation results show that the samples S10 to S17 having a silicide layer formed as a layer of the antireflection layer 3 serve as optical articles that have greatly reduced sheet resistance with no degradation in chemical resistant or moisture resistance, also have antistatic characteristics, etc., and further have high durability. As a result of the formation of a silicide layer, a slight increase in, absorption loss is observed. However, when the silicide layer is formed in such a manner to provide appropriate electrical conductivity for other purposes, such as to provide antistatic performance and electromagnetic shielding, the influence of absorption loss is almost negligible as an optical article. Therefore, when a silicide layer is formed as a layer of the antireflection layer 3, an optical article with high light transmittance together with excellent antistatic performance and electromagnetic shielding performance can be provided.

5. SAMPLES HAVING AN ORGANIC ANTIREFLECTION LAYER (GROUP C)

5.1 Example 18

Sample S18

5.1.1 Production of Sample S18

Figure 16:
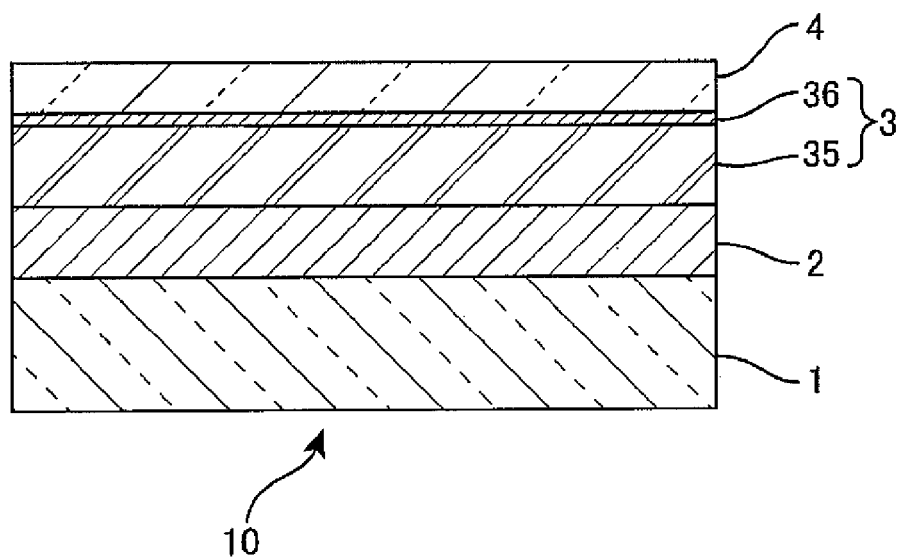
FIG. 16 is a sectional view of a lens that has an antireflection layer having the layer structure of group C.

A lens sample S18 having an organic antireflection layer 35 as shown in FIG. 16 was produced. First, in the same manner as in the above Example 1, a lens substrate 1 was selected, and a hard coating layer 2 was formed (see 2.1.1). On the surface of the hard coating layer 2, an antireflection layer 3 was formed by an organic layer 35.
Antireflection Layer To 47.8 parts by weight (0.08 mol) of fluorine-containing silane compound represented by a chemical formula $(CH_3O)_3Si-C_2H_4-C_6F_{12}-C_2H_4-Si(OCH_3)_3$ were added, as an organic solvent, 312.4 parts by weight of methanol and 4.7 parts by weight (0.02 mol) of non-fluorine-containing silane compound γ-glycidoxypropyltrimethoxysilane. Further, 36 parts by weight of decinormal aqueous hydrochloric acid solution was added thereto and mixed. The mixture was then stirred in a thermostat set at 25° C. for 2 hours to give a silicone resin with a solid content of 10 wt %.

To the silicone resin, as silica particles having inner cavity, a hollow silica/isopropanol dispersion sol (manufactured by CATALYSTS $ CHEMICALS, solid content: 20 wt %, average particle diameter: 35 nm, outer shell thickness: 8 nm) was added so that the solid content ratio between the silicone resin and the hollow silica was 70:30. Further, as a dispersion medium, 935 parts by weight of propylene glycol monomethyl ether was added for dilution to give a composition with a solid content of 3 wt %.

Then, as a metallic complex whose central metal is aluminum (Al(III)), acetylacetone aluminum (Al(acac)$_3$) was added to the composition to make a solid content of 3 wt % in the final composition (coating composition for forming an organic antireflection layer), and the mixture was then stirred for 4 hours. As a result, a coating composition for forming an organic antireflection layer for use as an antireflection treatment liquid was obtained.

A lens sample 10 having a hard coating layer 2 was subjected to plasma treatment with air plasma. Subsequently, the above-obtained antireflection treatment liquid was applied to the surface of the hard coating layer 2 by spinning to a dry thickness of 100 nm, and then placed in a thermostat maintained at 125° C. for 2 hours, to cure the applied antireflection treatment liquid. An organic antireflection layer 35 was thus formed on the surface of the hard coating layer 2.

Silicide Layer

After forming the organic antireflection layer 35, as pretreatment, a TiO$_2$ layer having a thickness of about 2 nm was formed on the organic antireflection layer 35 not by ion-assisted deposition but by ordinary vacuum deposition, and Si (metal silicon) atoms were then added thereto by ion-assisted deposition. A silicide layer 36 was thereby formed on the organic antireflection layer 35. The conditions of the ion-assisted deposition are as follows: kind of ions: argon and oxygen, ion-assisted voltage: 250 eV, current: 150 mA, ion-assisted deposition time: 5 seconds.

Antifouling Layer

After forming the silicide layer 36, an antifouling layer 4 was formed in the same manner as in Example 1 (see 2.1.3). In this manner, the lens sample S18 having the plastic substrate 1, the hard coating layer 2, the organic antireflection layer 35, the silicide layer 36, and the antifouling layer 4 was obtained (FIG. 16).

5.2 Evaluation of Sample

In the same manner as in 3.4 above, the sample S18 was evaluated for sheet resistance, absorption loss, chemical resistance (presence/absence of separation), and moisture resistance (presence/absence of swelling). The sheet resistance was $2\times10^{10}$ [Ω/sq], so excellent antistatic performance was provided. The optical absorption loss was about 0.6%, which would cause no problem when used as a spectacle lens, giving sufficient light transmittance. Moreover, the chemical resistance was Good, indicating that the sample has excellent chemical resistance in an ordinary environment. Swelling was not observed, indicating that the sample has excellent moisture resistance.

5.3 Discussion

The above evaluation results show that also in the organic antireflection layer 35, sheet resistance can be reduced by forming the silicide layer 36, and meanwhile, such an optical article exhibits no degradation in chemical resistance or moisture resistance, has antistatic characteristics, etc., and further has high durability. This therefore shows that not only in an inorganic layer but also in an organic layer, when a silicide layer is formed on the surface, an optical article with excellent antistatic performance and electromagnetic shielding performance can be provided.

6. CONCLUSION

Figure 17:
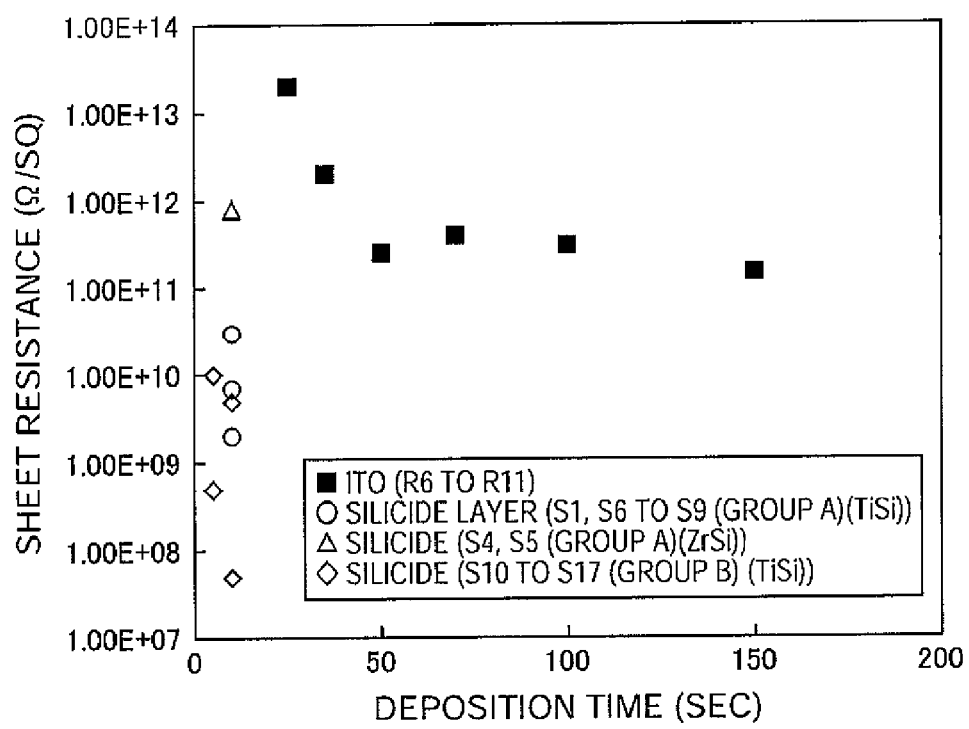
FIG. 17 shows the relation between sheet resistance and the deposition time for reducing the sheet resistance.

FIG. 17 shows the sheet resistance of the above samples S1 to S17 and R6 to R11 as a function of the time of silicon deposition for forming a silicide layer and the time of deposition for forming an ITO layer.

As obvious from the figure, sheet resistance can be easily reduced by forming a silicide layer on an oxide layer that forms the antireflection layer 3. Accordingly, an ITO layer, which causes a reduction in chemical resistance and moisture resistance, does not have to be formed for the sake of antistatic performance or the like. A silicide layer may also be formed by depositing silicide or by depositing a metallic oxide film (layer) followed by deposition of Si (metal silicon) on the surface thereof, for example. Accordingly, with little change from the conventional antireflection layer structure, material, and deposition process, lenses or like optical articles having low sheet resistance and high electrical conductivity can be provided.

The materials required to form a silicide layer are almost the same as those for forming conventional antireflection layers, and the layer can thus be produced at low cost. Further, the silicide layer can be formed from the same series of materials as those for conventional antireflection layers, and therefore exhibits excellent compatibility (matching) with an inorganic or organic antireflection layer, a hard coating layer, and an antifouling layer. In addition, as mentioned above, the durability against chemicals, moisture, and the like is also excellent.

Further, as mentioned above, the silicide layer may be formed not only by ion-assisted deposition of Si (metal silicon) but also by sputtering or a like method capable of providing a certain amount of energy or by deposition of a silicide itself, for example.

Figure 18:
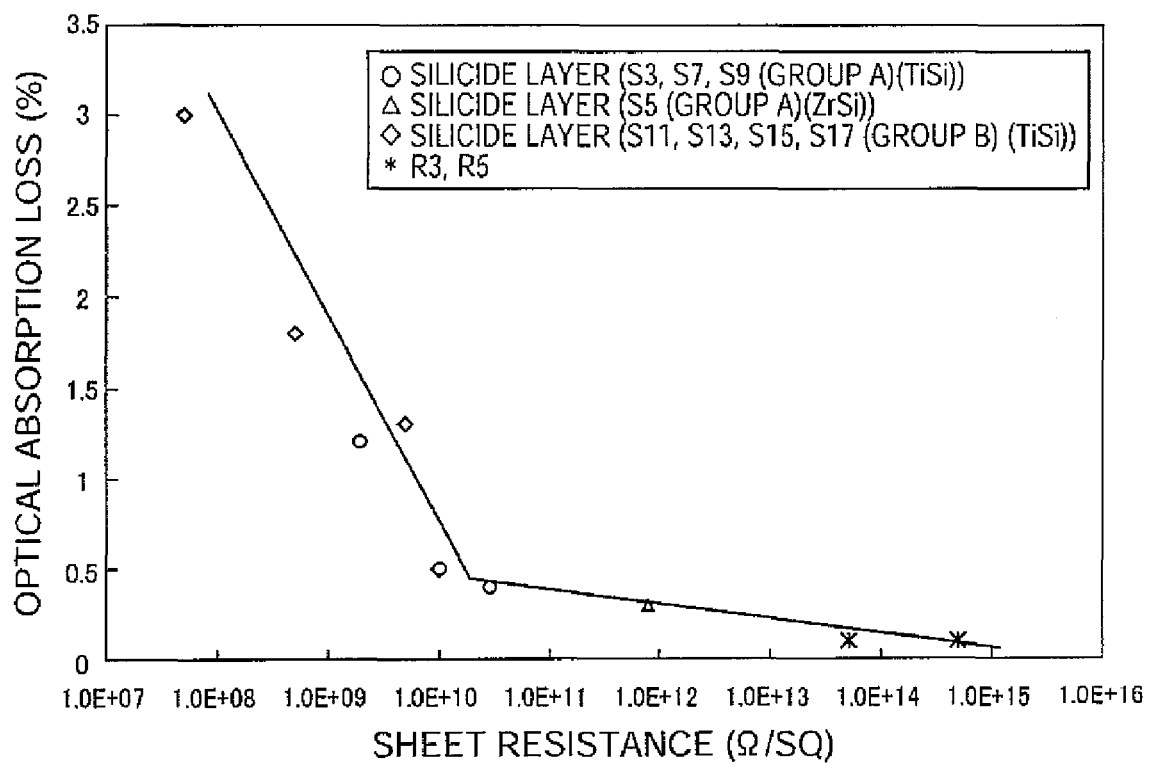
FIG. 18 shows the relation between measured sheet resistance and optical absorption loss.

FIG. 18 shows the optical absorption loss and sheet resistance of the above glass samples S3, S5, S7, S9, S11, S13, S15, S17, R3, and R5. As is obvious from the figure, when a silicide layer is present, and sheet resistance is thereby reduced, optical absorption loss tends to slightly increase. Especially when the sheet resistance as measured by the above measurement method is lower than near $1\times10^9$ to $1\times10^{10}$ [Ω/sq], the upward tendency of optical absorption loss increases. In addition, it has been revealed that dust adhesion is ameliorated when sheet resistance is not more than $5\times10^{12}$ [Ω/sq]. Accordingly, in the case of an optical article whose performance is greatly influenced by optical absorption loss, such an optical article preferably has its sheet resistance reduced to $1\times10^9$ to $5\times10^{12}$ [Ω/sq] by forming a silicide layer. Further, an optical article having its sheet resistance to $1\times10^{10}$ to $1\times10^{12}$ [Ω/sq] by forming an silicide layer is even more preferable.

The antireflection layer structures described herein are mere examples, and the invention is not limited thereto. For example, the invention is also applicable to an antireflection layer having three or fewer layers or nine or more layers, and the number of silicide layers is not limited to one. Further, the combination of high-refractive-index layer and low-refractive-index layer is not limited to $ZrO_2/SiO_2$ or $TiO_2/SiO_2$, and it is also possible to form a silicide layer on the surface of a layer of $Ta_2O_5/SiO_2$, $NdO_2/SiO_2$, $HfO_2/SiO_2$, $Al_2O_3/SiO_2$, or a like series.

Figure 19:
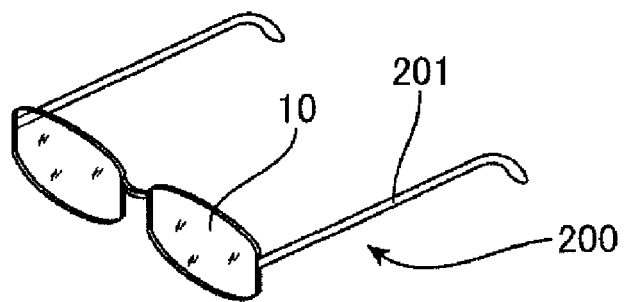
FIG. 19 is a schematic diagram of spectacles.
Figure 20:
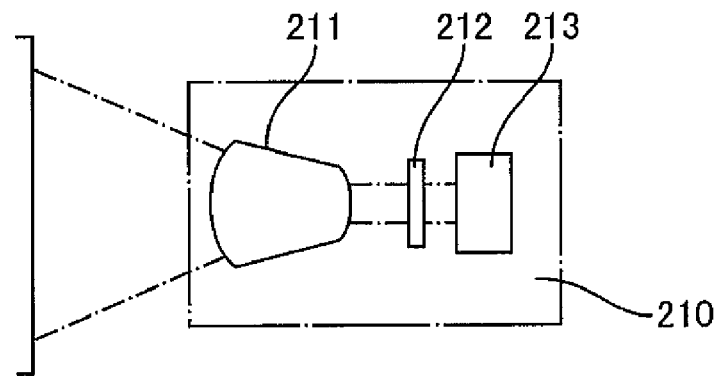
FIG. 20 is a schematic diagram of a projector.
Figure 21:
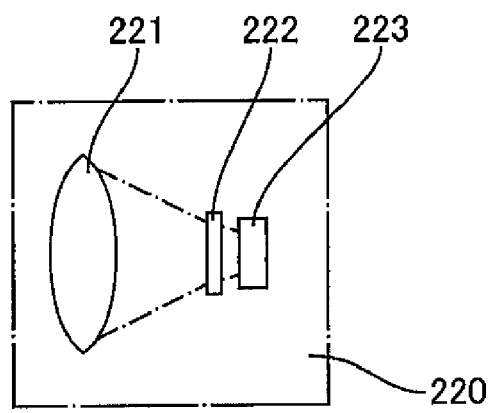
FIG. 21 is a schematic diagram of a digital camera.
Figure 22:
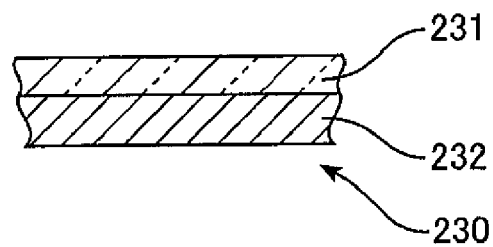
FIG. 22 is a schematic diagram of a recording medium.

FIG. 19 shows a pair of spectacles 200 comprising a spectacle lens 10 having the above silicide layer and a frame 201 having mounted thereon the spectacle lens 10. FIG. 20 shows a projector 210 comprising a lens 211 having the above silicide layer, a cover glass 212 having an silicide layer, and an image-forming apparatus, for example, LCD 213, that produces light to be projected through the projection lens 211 and the cover glass 212. FIG. 21 shows a digital camera 220 comprising an imaging lens 221 having the above silicide layer, a cover glass 222 having an silicide layer, and an imaging apparatus, for example, CCD 223, for capturing an image through the imaging lens 221 and the cover glass 222. Further, FIG. 22 shows a recording medium, for example, DVD 230, comprising a permeable layer 231 formed as the above silicide layer and a recording layer 232 capable of optically reading and writing the record.

The optical article of the invention allows a wide variety of applications to such systems as an optical article therein, such as a lens, a glass, a prism, or a cover layer. The systems mentioned above are mere examples, and other optical articles and systems to which a person skilled in the art can apply the invention are encompassed by the scope of the invention.

The entire disclosure of Japanese Patent Application Nos: 2009-005421, filed Jan. 14, 2009 and 2009-197787, filed Aug. 28, 2009 are expressly incorporated by reference herein.

What is claimed is:

1. A method for producing an optical article, comprising:
    forming a first layer that is light-transmissive on an optical substrate directly or with an additional layer in between, and
    forming a light-transmissive thin film containing silicide on a surface of the first layer to provide an antistatic function and/or an electromagnetic wave shielding function,
    wherein the first layer is included in an inorganic or organic antireflection layer.

2. A method for producing an optical article according to claim 1, wherein forming the light-transmissive thin film containing silicide includes depositing silicon and metal on the surface of the first layer.

3. A method for producing an optical article according to claim 1, wherein forming the light-transmissive thin film containing silicide includes depositing a transition metal silicide on the surface of the first layer.

4. A method for producing an optical article according to claim 1, wherein:
    the first layer contains metal oxide, and
    forming the light-transmissive thin film containing silicide includes implanting silicon into the surface of the first layer.

5. A method for producing an optical article according to claim 2, further comprising forming an antifouling layer on the light-transmissive thin film containing silicide directly or with an additional layer in between.

6. An optical article comprising:
    an optical substrate,
    a first layer that is light-transmissive and formed on the optical substrate directly or with an additional layer in between, and
    a light-transmissive thin film containing silicide formed on a surface of the first layer to provide an antistatic function and/or an electromagnetic wave shielding function,
    wherein the first layer is included in an inorganic or organic antireflection layer.

7. An optical article according to claim 6, wherein the antireflection layer has a multilayer structure, and the antireflection layer includes the first layer and the light-transmissive thin film containing silicide.

8. An optical article according to claim 7, further comprising an antifouling layer formed on the light-transmissive thin film containing silicide directly or with an additional layer in between.

9. An optical article according to claim 6, wherein the optical substrate is a plastic lens substrate.

10. An optical article according to claim 9, wherein the optical article is a spectacle lens.

11. A pair of spectacles comprising:
    the spectacle lens of claim 10, and
    a frame having mounted thereto the spectacle lens.

12. A system comprising:
    the optical article according to claim 6, and
    an image-forming apparatus for projecting an image through the optical article.

13. A system comprising:
    the optical article according to claim 6, and
    an imaging apparatus for capturing an image through the optical article.

14. A system comprising:
    the optical article according to claim 6, and
    a medium that allows access through the optical article.

* * * * *